(12) United States Patent
Zaliznyak et al.

(10) Patent No.: US 6,246,259 B1
(45) Date of Patent: *Jun. 12, 2001

(54) HIGH-SPEED PROGRAMMABLE LOGIC ARCHITECTURE HAVING ACTIVE CMOS DEVICE DRIVERS

(75) Inventors: Arch Zaliznyak; Yogendra K. Bobra, both of San Jose; Madhavi Kola, Sunnyvale, all of CA (US)

(73) Assignee: Xilinx, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/073,097

(22) Filed: May 5, 1998

Related U.S. Application Data

(60) Provisional application No. 60/075,750, filed on Feb. 23, 1998.

(51) Int. Cl.[7] .................................................. H01L 25/00
(52) U.S. Cl. ................................. 326/41; 326/83; 326/57
(58) Field of Search ................................. 326/83, 39, 41, 326/57, 112, 119, 121

(56) References Cited

U.S. PATENT DOCUMENTS

| | | | |
|---|---|---|---|
| 3,967,059 | 6/1976 | Moore, III et al. | 178/58 A |
| 4,410,816 | 10/1983 | Kanai | 307/455 |
| 4,713,557 | 12/1987 | Carter | 307/242 |
| 4,761,615 | 8/1988 | Maloberti et al. | 330/277 |
| 4,806,794 | 2/1989 | Walters, Jr. | 307/451 |
| 4,999,519 | 3/1991 | Kitsukawa et al. | 307/446 |
| 5,059,830 | * 10/1991 | Tokumaru et al. | 307/481 |
| 5,202,593 | 4/1993 | Huang et al. | 307/475 |
| 5,218,240 | 6/1993 | Camarota et al. | 307/443 |
| 5,225,723 | * 7/1993 | Drako et al. | 307/480 |
| 5,298,810 | 3/1994 | Scott et al. | 307/475 |
| 5,306,967 | 4/1994 | Dow | 307/482 |
| 5,338,982 | * 8/1994 | Kawana | 307/465 |
| 5,341,040 | 8/1994 | Garverick et al. | 307/443 |
| 5,355,029 | 10/1994 | Houghton et al. | 307/443 |
| 5,355,035 | 10/1994 | Vora et al. | 307/494 |
| 5,381,059 | 1/1995 | Douglas | 326/58 |
| 5,397,937 | 3/1995 | Ueda et al. | 326/110 |
| 5,397,943 | 3/1995 | West et al. | 326/39 |
| 5,399,925 | * 3/1995 | Nguyen | 326/58 |
| 5,491,429 | * 2/1996 | Gasparik | 326/27 |
| 5,497,108 | 3/1996 | Menon et al. | 326/84 |
| 5,504,440 | * 4/1996 | Sasaki | 326/39 |
| 5,548,229 | * 8/1996 | Segawal et al. | 326/57 |
| 5,592,104 | * 1/1997 | Bach | 326/27 |
| 5,612,631 | 3/1997 | Agrawal et al. | 326/39 |
| 5,614,844 | 3/1997 | Sasaki et al. | 326/84 |
| 5,625,301 | 4/1997 | Plants et al. | 326/41 |

* cited by examiner

*Primary Examiner*—Patrick Wamsley
*Assistant Examiner*—Anh Tran
(74) *Attorney, Agent, or Firm*—Lois D. Cartier

(57) ABSTRACT

A field programmable logic device features an active device driver employing CMOS circuitry that includes a complementary CMOS inverter in electrical communication with a tri-state CMOS inverter, with the tri-state CMOS inverter defining a data input and a data output of the active device driver. The CMOS complementary inverter has an input node and an output node. The CMOS tri-state inverter is coupled to the input node, defining a control input for the active device driver.

3 Claims, 18 Drawing Sheets

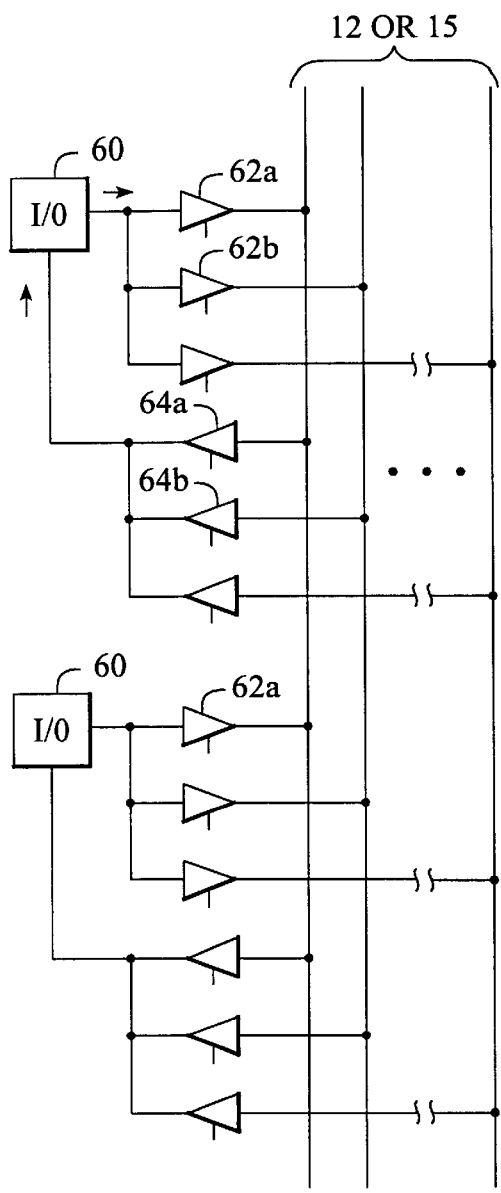
*Fig.* 3
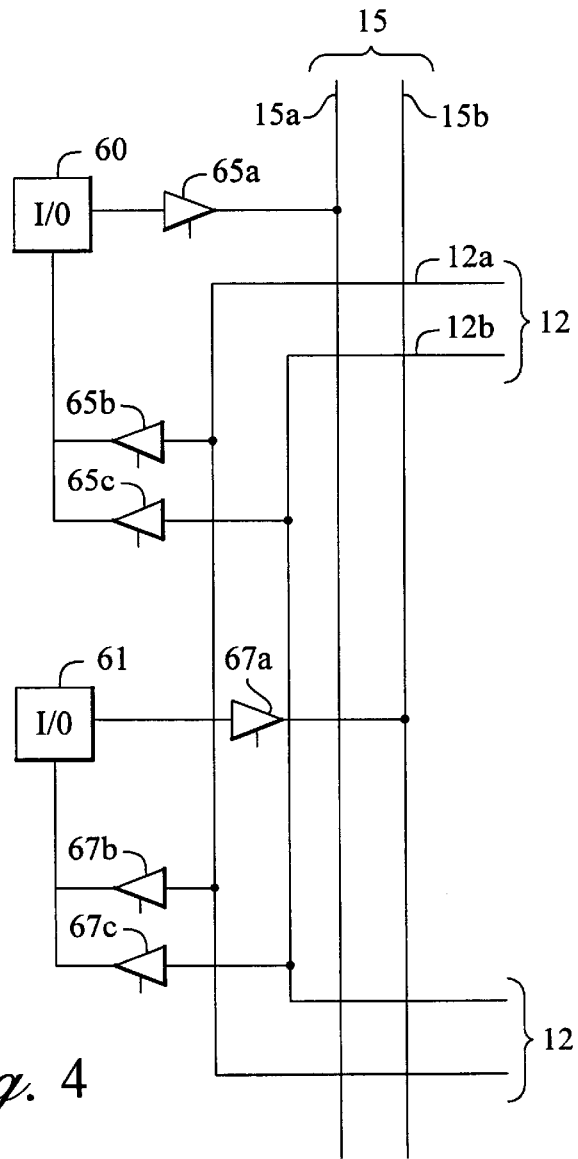
*Fig.* 4

HIGH-SPEED PROGRAMMABLE LOGIC ARCHITECTURE HAVING ACTIVE CMOS DEVICE DRIVERS

CROSS REFERENCE TO RELATED APPLICATIONS

This application is a nonprovisional application of U.S. provisional patent application "CMOS TRISTATE BUFFERS," U.S. Serial No. 60/075,750, filed Feb. 23, 1998, having Arch Zaliznyak, Yogendra K. Bobra and Madhavi Kola listed as co-inventors and assigned to Dyna-Chip Corporation. The 60/075,750 application is hereby incorporated by reference in its entirety.

BACKGROUND OF THE INVENTION

This invention relates to programmable logic, and in particular to an active driver circuit particularly suited for a high speed programmable logic device.

A programmable logic device (PLD) is a programmable integrated circuit that allows the user of the circuit, using software control, to customize the logic functions the circuit will perform. A typical PLD consists of an array of identical logic cells that can be individually programmed, and which can be arbitrarily interconnected to each other to provide internal input and output signals, thus permitting the performance of highly complex combinational and sequential logic functions. The program is implemented in the PLD by setting the states of programmable elements such as memory cells.

One type of programmable logic, known as programmable logic arrays (PLA), is a combinatorial two-level AND/OR integrated circuit which can be programmed to perform sum-of-products logic. Such devices typically consist of a series of AND gates having input terminals which can be programmably connected to chip input signals, and a series of OR gates which may be programmably connected to receive the output signals from the AND gates.

Another type of programmable logic device is known as programmable array logic (PAL). PALs use a fixed OR array and bidirectional input/output pins. A disadvantage of both PALs and PLAs is the lack of density with which they may be programmed. In other words, although the array is capable of performing many logic functions, utilization of the array is not as complete as desirable. Furthermore the size of the array increases faster than its programming capability.

A response to this problem has led to the development of the field programmable gate arrays (FPGAs) which have "macrocells" or logic blocks in programmable logic devices. A macrocell or logic block is a small grouping of logic capable of performing many different functions, and being selectively interconnectable to other macrocells or logic blocks. This allows the logic in the programmable logic device to assume a more granular structure in which pieces of the logic communicate with other pieces, to provide an overall more efficient utilization of the integrated circuit. For purposes of the present specification, "programmable logic device" is defined as a programmable array logic (PALs), programmable logic arrays (PLAs), field programmable gate arrays (FPGAs), and other types of programmable logic devices (PLDs).

A significant disadvantage of all programmable logic devices presently available is their relatively slow speed. In all of the programmable logic devices described above, the connections within the AND and OR arrays, as well as to and from the macrocells, are made by various transfer gates. Examples of transfer gates include erasable programmable read only memory cells, electrically erasable read only memory cells, static random access memory cells, fuses, antifuses, or the like. In each of these cases, the interconnection approach is passive. That is, the state of the transfer gate is itself used to control some other apparatus which makes or breaks a connection between two nodes, and the signals presented to the connection simply pass through the connection (or do not pass if the connection is open). As a result, the overall speed of the programmable logic device is limited. One of the primary reasons for the relatively slow operating speed of prior art programmable logic devices is the resistance present in the interconnection system. The interconnection system is the programmable "wiring" by which the logic signals are propagated across the integrated circuit chip. This propagation speed is limited by the series resistance of the transfer gates employed, whether formed as EPROM cells, SRAM cells, antifuses, or otherwise.

To overcome these drawbacks, the aforementioned passive interconnection system is replaced by an active interconnection system such as the system described in U.S. Pat. No. 5,504,440 to Sasaki, which is assigned to the assignee of the present invention. Disclosed therein is an architecture for a programmable logic device that includes controllable active buffer circuits to interconnect the programmable logic elements, as well as input and output data buses. In this fashion, the programmable logic device operates at substantially faster clock rates than programmable logic devices employing passive interconnect circuitry.

U.S. Pat. No. 5,614,844 to Sasaki et al., which is assigned to the assignee of the present invention, discloses active device drivers for programmable logic devices. The active device drivers are described as formed from BiCMOS technology. In this fashion, the speed advantages of bipolar technology is achieved while taking advantage of the lower power consumption of CMOS technology.

What is needed, however, is an active driver circuit for a programmable logic device which consumes less power than the prior art without unduly reducing the operating speed of a programmable logic device.

SUMMARY OF THE INVENTION

A field programmable logic device features an active device driver employing CMOS circuitry which reduces the capacitive loading of signal paths coupled thereto. In one embodiment, the active device driver is unidirectional and includes a complementary CMOS inverter in electrical communication with a tri-state CMOS inverter, with the tri-state CMOS inverter defining a data input and a data output of the active device driver. The CMOS complementary inverter has an input node and an output node. The CMOS tri-state inverter is coupled to the input node, defining a control input for the active device driver.

In an exemplary embodiment, the active device drivers are employed in a programmable logic device that includes logic cells, in which logic functions are performed, a set of input lines and a set of output lines, with the output lines extending transversely to the set of input lines. Where the input and output lines cross, junction regions are established at which point one or more of the active device drivers described above are coupled to selectively allow connections between selected ones of the set of output lines and selected ones of the set of input lines to enable signals present on the output lines to be placed on desired ones of the input lines. Each of the active device drivers are capable of being placed in at least an active state in which the active device drivers invert a signal supplied to it, or in a passive state in which it presents a high impedance between its input and output. Typically, the active device drivers enable each output line in the set to be connected to any desired ones in the set of input lines.

In another embodiment, a structure similar to that described above is employed, but provides a set of active device drivers to selectively interconnect desired ones of the input lines and the output lines to the logic cells. In this manner, input signals present on the input lines can be supplied to the appropriate nodes of the logic cell, and output signals from the logic cells can be supplied to other desired logic cells or other circuitry.

The active device drivers may also be employed in the interface circuit between the integrated circuit pins and the sets of input and output lines. The active device drivers allow desired connections between the pins of the integrated circuit and the input and output buses, thereby enabling desired signals presented at the chip pins to be supplied to appropriate logic cells, and the output from those logic cells to be applied to appropriate pins, as well.

The tri-state inverter includes first and second serially connected pull-up transistors and first and second serially connected pull-down transistors, each of which includes a gate, a source and a drain. The first pull-up transistor is connected between a first reference voltage and a second pull-up transistor, and the first pull-down transistor is connected between a second reference voltage and the second pull-down transistor. The gate of the first pull-down transistor is connected to the input node, defining the control input. The gate of the first pull-up transistor is connected to the output node. The source of the second pull-up transistor is connected with the drain of the second pull-down transistor, defining the driver data output, and the gates of the same are coupled together, defining the driver data input. Typically, the first and second pull-up transistors are p-channel devices, the first and second pull-down transistors are n-channel devices, and the complementary CMOS inverter includes serially connected p-channel and n-channel devices. In an alternative embodiment, a bidirectional active device driver is described. The bidirectional active device driver comprises two unidirectional active device drivers connected so that the driver data input of one is coupled to the driver data output of the other.

In another embodiment, the gate of the first pull-down transistor is connected to the gate of the first pull-up transistor, defining the driver data input. The gate of the second pull-down transistor is connected to the input node of the complementary CMOS inverter, defining the control input, and the gate of the second pull-up transistor is connected to the output node. In this fashion, the effect of diffusion capacitance on signal propagation delay is reduced. A bidirectional embodiment of this device is also described. Finally additional embodiments of non-inverting device drivers are described which are both unidirectional and bidirectional.

For a further understanding of the objects and advantages of the present invention, reference should be made to the ensuing detailed description taken in conjunction with the accompanying drawings.

BRIEF DESCRIPTION OF THE DRAWINGS

FIG. 3 is a schematic illustrating one embodiment of a circuit for interconnecting the integrated circuit input/output pins with the input/output buses;

FIG. 4 illustrates another embodiment of a circuit for interconnecting the integrated circuit input/output pins with the input/output buses;

DESCRIPTION OF THE SPECIFIC EMBODIMENTS

Figure 1:
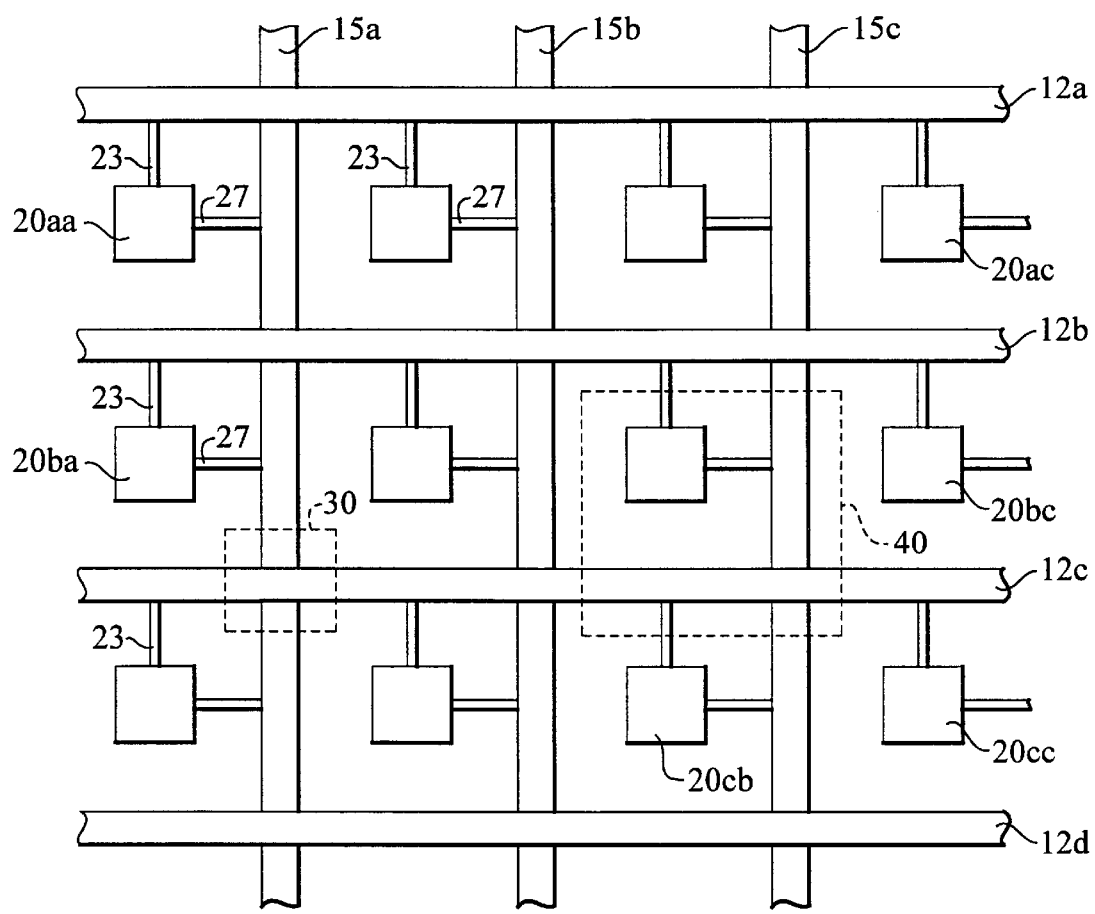
FIG. 1 is a block diagram showing an overall layout of an integrated circuit employing programmable logic device architecture.

FIG. 1 is a block diagram illustrating the overall layout of a high speed programmable logic device fabricated according to a preferred embodiment of our invention. As shown in FIG. 1, the device includes a first set of routing channels 12 disposed generally in an east/west orientation, a second set of routing channels 15 disposed generally in a north/south orientation, and a series of logic cells 20 disposed within the matrix of routing channels.

In the conventional manner of programmable logic device operation, the routing channels contain buses of conductors for supplying input signals to the logic cells, and receiving output signals therefrom. Often, the output signals from a logic cell are used as the input signals to another logic cell.

As is well known, each logic cell can perform any desired logical operation, either combinatorial or sequential, or both, upon the input signals supplied to it. The particular logic function performed by a logic cell depends upon its program state, which is typically "loaded" into the cell using external circuitry. The state is defined using control bits from the external apparatus to set multiplexers, flip-flops, gates, etc.

In the general block diagram of FIG. 1, the logic cells 20 receive input signals from buses 12, and supply output signals onto the buses 15. The input signals are transmitted from the bus and supplied to the logic cell by conductors 23, and the resulting output signals are supplied to the output buses 15 using conductors 27. As will be explained, these conductors themselves are programmable in the sense that the input nodes of the logic cells may either be connected to, or disconnected from, selected lines in the input data bus 12. Of course, as mentioned, the input data bus itself may carry as signals output information from other logic cells.

Connections between the input and output data buses may be made in location 30, where these buses cross each other. Although the buses are depicted as crossing each other in the drawing of FIG. 1, in actual practice they are formed using different levels of metal or other conductive material on an integrated circuit, and are electrically isolated from each other unless an electrical connection between them has been "programmed." The manner in which the conductors may be coupled to each other in the crossing regions 30 is described further below.

An advantage of this structure is that it is modular. As shown within dashed line 40, essentially all of the integrated circuit area is consumed using regular modules 40 which include the interconnecting buses 12 and 15, the logic cell 20, and the buses 23 and 27 to provide signals to, and receive signals from, the logic cell. This modular structure facilitates an efficient layout of the integrated circuit.

Thus, as shown, each output of a logic cell extends for the entire vertical span of the chip layout. The output buses extend along only one side of the logic cell, and stop at the chip edges. The input buses, however, "wrap-around" at the periphery of the integrated circuit. For example, buses 12a and 12b will be connected together at the east end or the west end of the circuit. In this manner, the input buses extend in a serpentine fashion across the surface of the entire circuit. Thus, bus 12a will be connected to bus 12b at either the eastern edge or the western edge of the chip, then bus 12b coupled to bus 12c at the opposite edge, etc.

The input and output buses are typically unidirectional over the shortest segments, but can be made bidirectional in different segments of a common bus by isolating the segments from each other, discussed more fully below. Depending upon the length of the buses, the input/output signal strength, and other factors, it may be desirable to employ "repeaters" within the buses. These repeaters consist of small unidirectional or bidirectional active device drivers employing a CMOS circuit in accordance with the present invention. These active device drivers isolate the capacitances in the circuit, and thereby decrease signal propagation delays, enhancing overall system speed.

Figure 2:
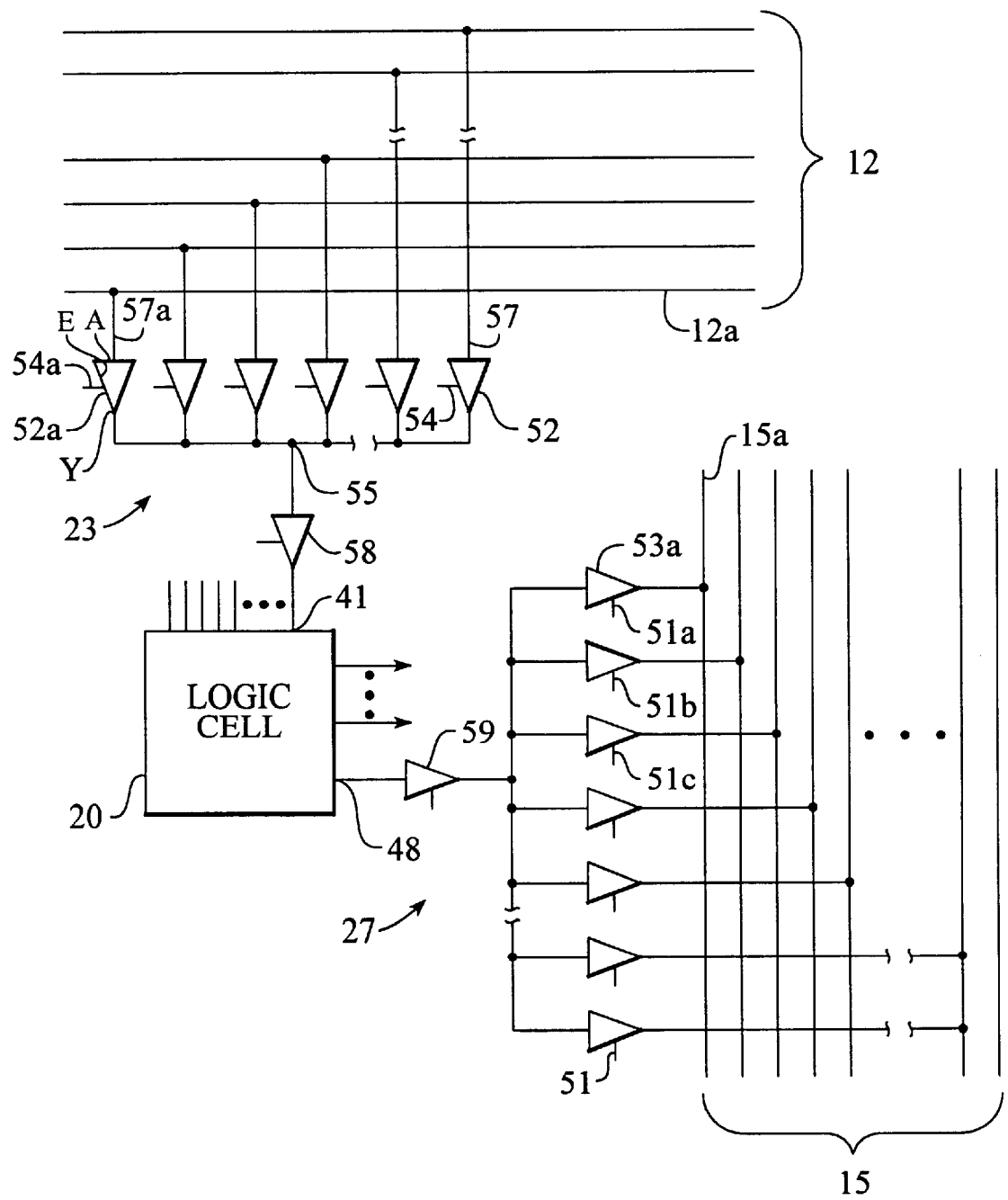
FIG. 2 is a schematic diagram illustrating the manner in which input signals are supplied to, and output signals are received from, a logic cell shown in FIG. 1.

FIG. 2 is a more detailed view of the interconnection system between a logic cell 20 and its input bus 23, and between the logic cell 20 and its output bus 27. It should be appreciated that any desired number of inputs and outputs may be provided to and from a logic cell. The drawing in FIG. 2 illustrates the general approach to forming these interconnections and programmably controlling the connections.

As shown in FIG. 2, an input bus 12 has a series of conductors which may be selectively connected to an input node 41 of the logic cell using driver circuits 52 and 58. Although the drawing depicts each conducting line in the bus 12 as being separately connectable to the input node 41, this is only for the purpose of illustration. In actual implementations of our circuit, each input node need not be connected to every line on the bus, as will become apparent in conjunction with a discussion of the fabrication of the logic cell below.

In any event, in the drawing each bus line in bus 12 is separately connected through an active device driver. The active device driver functions as a programmable three state buffer operating under control of an input signal supplied to a control input "E" on line 54. The control input "E" is coupled to a register or other means within which the program for controlling the overall programmable logic device is stored. For example, active device driver 52a is either active or in a high impedance state. When the signal is present at the control input "E" over line 54a, active device driver 52a is enabled to allow a signal, transmitted on line 57a, to propagate from the data input "A" and be placed on the data output "Y" so as to be inverted. In other words, if a logical 1 is present on conductor 12a of bus 12, then the data input "A" of active device driver 52a will be a logical 1. Assuming that a signal is present on control line 54a, then the data output "Y" from active device driver 52a will have a logical 0 present. Were a logical 0 present on conductor 12a, the data output "Y" from active device driver 52a would be at a level of a logical 1. Were a logical 0 present at the control input "E", the output "Y" would have a high impedance "Z" associated with it. Each of the active device drivers 52 functions in the same manner as an inverting unidirectional active device driver.

On the other hand, if a signal is not present on control line 54, then the active device driver is not enabled and presents a high impedance state and functionally behaves as an open circuit. In other words, node 55 is completely disconnected from bus 12. This allows an input node 41 to be disconnected from the bus 12 when that input node is not to receive signals from bus 12.

In some embodiments of our invention, another active device driver 58 is provided between node 55 and node 41. This additional circuit can be employed to help reduce the capacitive loading on the input node 41. Although not shown in FIG. 2, each of the other input nodes to the logic cell 20 is similarly coupled to the input signal bus 12.

The output signal bus 15 is coupled to the logic cell 20 using a similar technique. As shown, the logic cell provides an output node 48 which is supplied to an optional active device driver 59. Active device driver 59 is provided for the same reasons as circuit 58, that is, to reduce the capacitive loading and drive circuit requirements on the logic cell. For logic cells with output drive power sufficient to drive a large capacitance, active device driver 59 is unnecessary.

The output from active device driver 59 is coupled to the input of active device driver circuits 53, each of which operates under program control using information supplied on a corresponding line 51. Line 51 may be connected to a single shift register element, memory cell or other storage. Active device drivers 53 function in the same manner as active device driver 52, that is, they either drive the corresponding output bus line with the signal presented at their input node, or present a high impedance condition to the output bus. In the high impedance state, signals supplied by the logic cell are prevented from influencing the state of the particular bus conductor. Thus, the overall output connections 27 (as shown in FIG. 1) are the reverse of the input connections 23 (shown in FIG. 1).

In another embodiment of this invention, the active device drivers 52, 53, 58, and 59 can be replaced with multiplexers. In this case the control lines 51 and 54 supply control signals to select among the multiplexer input lines, connecting the appropriate one to the logic cell.

FIG. 3 illustrates the routing structure of the preferred embodiment of our programmable logic device in further detail. Shown in FIG. 3 is the manner in which signals presented at the input/output pins of the integrated circuit are supplied to and received from the interconnecting input and output buses of the programmable logic device. As shown in FIG. 3, two example I/O pins 60, 61 are connected, again through circuits 62, to the input/output buses 12 or 15. Although the drawing is shown with the bus extending in a north/south direction, it should be appreciated that the circuitry depicted can perform the same function whether the bus is an input bus 12 or an output bus 15. Furthermore, each input/output pad 60 can be coupled to both input and output buses by simply repeating the structure shown in FIG. 3. Thus, the input connection 60 is connectable through driver circuits 62a, 62b, . . . , to any one of the lines 12. This allows an input signal presented at pad 60 to be placed on the bus 12 for supply to any one of the logic cells on the integrated circuit. Similarly, output active device drivers 64a, 64b, etc., allow signals present on the bus to be communicated from the bus to the output pad. As mentioned above, although the structure depicted illustrates only the output bus, the entire structure of FIG. 3 can be repeated to allow connections to the input buses. Of course, as many input and output pins as desired may be used.

FIG. 4 is a diagram illustrating an alternative approach to the interconnections between the input/output pads and the buses. As shown in FIG. 4, the input buses 12a and 12b extend in a serpentine manner past the input/output pads 60, 61. In contrast the output buses 15a, 15b extend vertically past the I/O pads. I/O pad 60 is selectively connectable to output bus 15a using programmable driver 65a. It is also selectively connectable to bus 12a via active device driver 65b and bus 12b via driver 65c. In a similar manner, input/output pad 61 can be connected to drive output bus 15b with active device driver 67a, and can be connected to receive signals from either bus line 12a or bus line 12b using active device drivers 67b and 67c, respectively. In this configuration the inputs behave like cell outputs and become part of bus 15 viewed differently, and input pad to the chip can be considered as the output from an external source off the chip.

Figure 5:
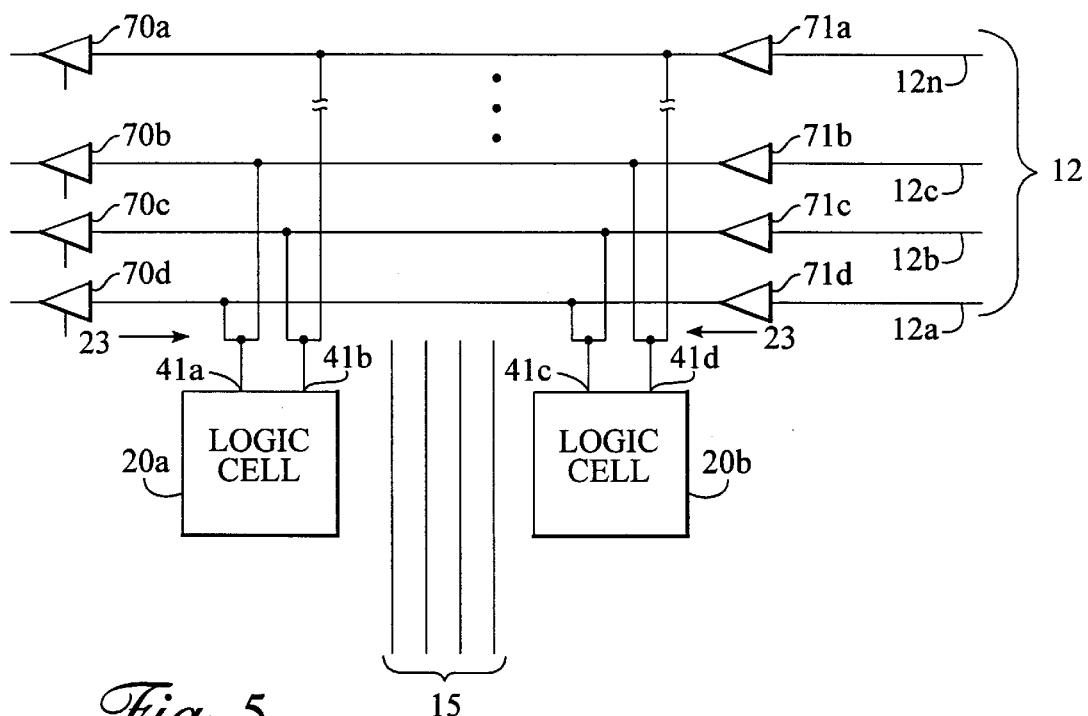
FIG. 5 illustrates how unidirectional active device drivers may be employed in the input or output buses, together with a technique for lowering the number of interconnections between the logic cells and such buses.

FIG. 5 illustrates another aspect of the input and output buses of our system. As shown in FIG. 5, bus 12, for example an input bus, extends across the upper portion of the figure. Input bus 12 is coupled to logic cells 20 using the same techniques as shown in FIG. 2. For simplicity, however, the active device drivers in the local bus 23 between the input bus 12 and the logic cells 20 are not shown. These are provided in the manner described above.

Also, for illustration, the input terminals 41 to the logic cell 20 are shown as not being connectable to all lines of the input bus 12. Although it may seem desirable to provide a connection between every input line and every input node of every logic cell, in practice this is unnecessary. A more efficient design can be achieved by simply providing sets and subsets of connections between the bus and the logic cell. For example, logic cell 20a is shown as having an input node 41a connectable to bus lines 12a and 12c, and an input node 41b connectable to bus lines 12b and 12n. In contrast, logic cell 20b has input nodes 41c connectable to bus lines 12a and 12b, while node 41d is connectable to bus lines 12c and 12n. Thus, if a logic function were to be performed using as input signals to logic cell 20, only the data on lines 12a and 12b, then logic cell 20a would be employed for that function (and would be selected by the software for that task). By employing logic cell 20a, input 41a of the cell can receive the input signal on line 12a, while input 41b can receive the input signal on line 12b.

Another feature of our system shown in FIG. 5 is the use of driver circuits in the bus lines themselves. If the bus lines are allowed to extend in the serpentine manner across the surface of the entire chip without interruption, a very high capacitance load is placed on the cell output drivers. This high capacitance requires the drivers for driving the input signal to consume extra power and operate undesirably slowly. To overcome this problem, we provide driver circuits 70 at selected intervals along the bus lines. Although depicted in conjunction with an input bus 12, the same technique is employed in the output bus 15.

In FIG. 5, these active device drivers are shown as being disposed every two logic cells along the bus. The actual number of active device drivers in a particular design is determined by space, speed, and flexibility tradeoffs.

For the embodiment depicted in FIG. 5, some of the active device drivers 70 have been made programmable, while other active device drivers 71 are not programmable. Active device drivers 71 are provided in an always ON condition. In other words, whatever signal is provided at their input node is reproduced at their output node.

Active device drivers 70, however, are made programmably controllable, and can employ the same circuitry as the driver circuits. Each of active device drivers 70 is similar to the active device drivers discussed above, for example active device drivers 52 and 53 in FIG. 2. The capability of placing the circuits in high impedance condition allows the input bus (or the output bus) to be divided into smaller "pieces." For example, if the function of bus line 12a is only to provide an input signal to node 41a in logic cell 20a, active device drivers 70d may be turned OFF. This eliminates the need for whatever driving circuit is driving bus line 12a to drive the extra capacitance of that bus line beyond active device drivers 70d. Furthermore, it allows that portion of the bus line 12a beyond active device driver 70d to be utilized for other purposes, for example, to function as a "local" connection between two logic cells.

Figure 6:
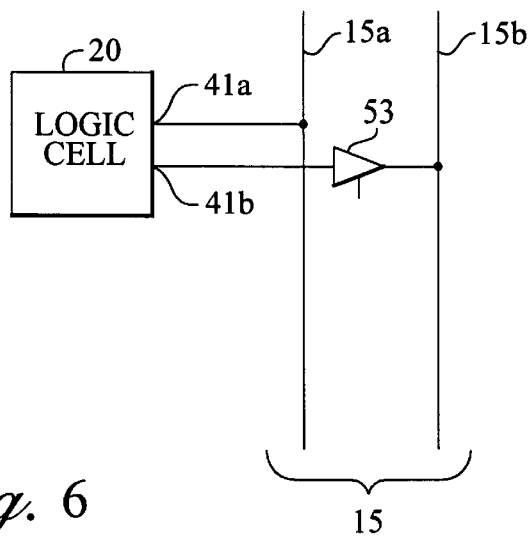
FIG. 6 illustrates another technique for reducing the number of connections.

FIG. 6 illustrates a further refinement of the routing structure of our system. As shown in FIG. 6, some output nodes 41a from the logic cell 20 can provide dedicated connections to the output bus line 15a. At the same time, other connections from the logic cell, for example output 41b, can provide controllable or programmable connections to the output bus line 15b using a driver circuit 53. This eliminates unnecessary driver circuits, and allows optimizing the design to suit a class of logical functions to be provided. In a typical implementation of our system, some connections will be attached without driver circuits, as shown in node 41a, while others will use a programmable connection, as shown for node 41b.

Figure 7:
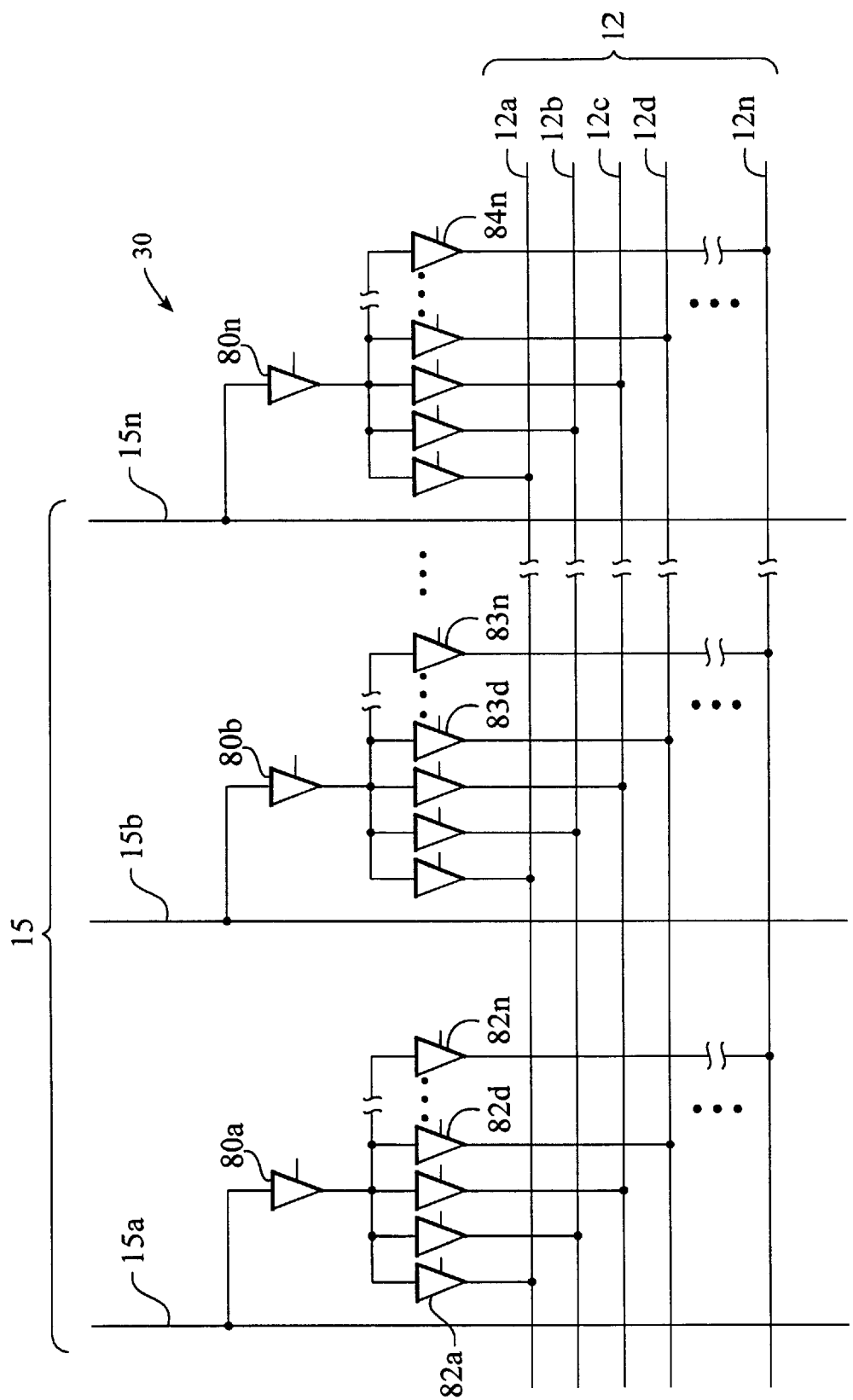
FIG. 7 is a schematic drawing of circuitry which may be employed to provide interconnections between the input and output buses, for example, at locations where they cross.

FIG. 7 is a diagram illustrating a more detailed view of the bus interconnection region 30 shown in FIG. 1. The drawing illustrates three of the output bus lines 15a, 15b, and 15n, and five of the input bus lines 12a, 12b, 12c, 12d, and 12n. Programmable active device drivers, like those described above, enable the connection of any output bus to any input bus. For example, assume that it is desired to supply the output information on bus line 15b to input bus 12d. To achieve this, active device driver 80b will be programmed ON, thereby replicating the state of bus 15b at node 85. In addition, active device driver 83d will be programmed ON, to pass the state of node 85 to input bus 12d. All other programmable active device drivers 83 will be programmed OFF in their high impedance state to prevent the information on node 85 from being placed on any of the other bus lines.

For illustration, also assume output bus line 15a is not to be coupled to any of the input bus lines 12a, 12b, . . . , 12n. To achieve this, circuit 80a will be programmed OFF, as well as all circuits 82. This will isolate output bus 15a from input buses 12. In this manner, any desired output bus can be coupled to any desired input bus.

Figure 8:
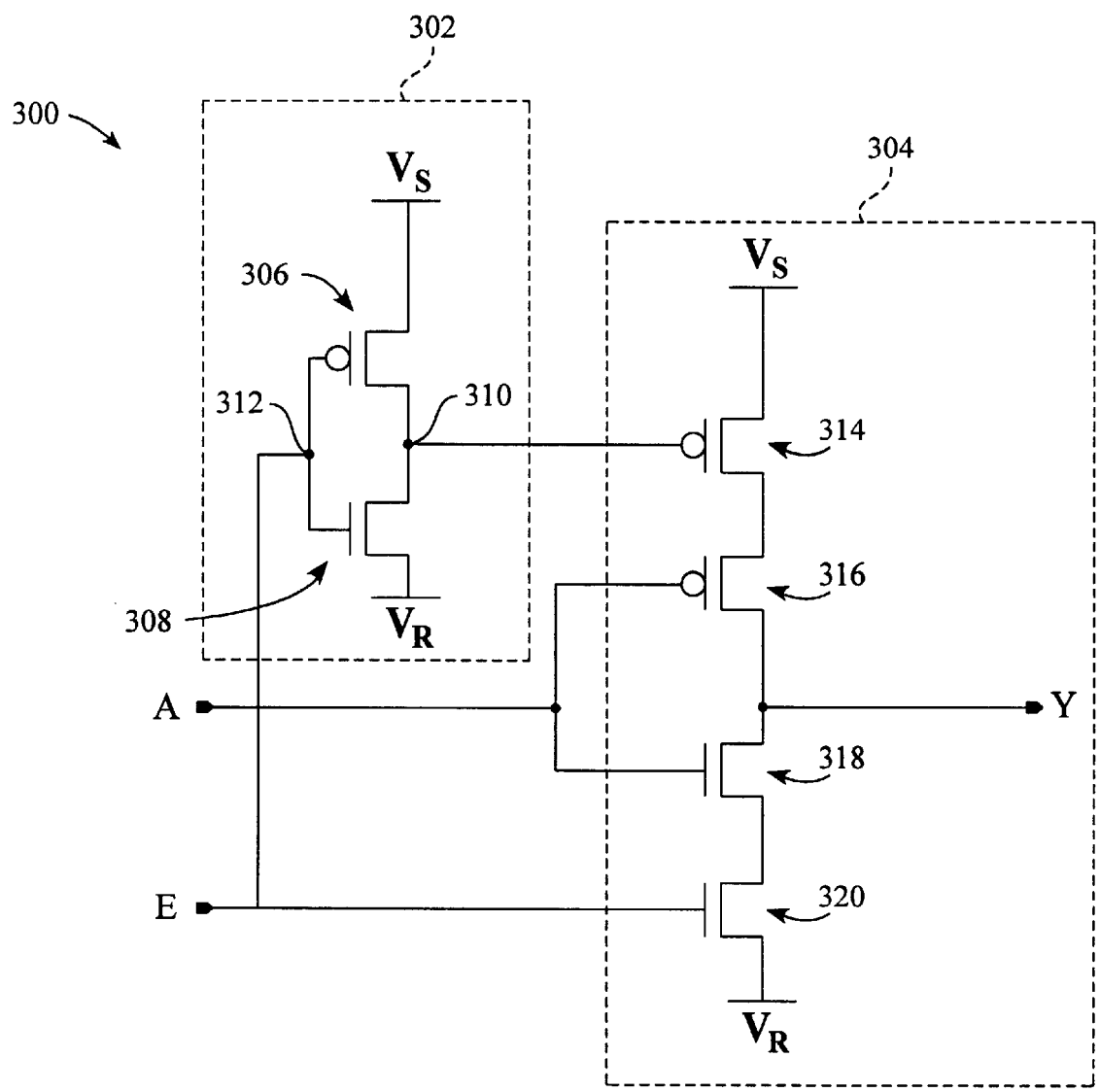
FIG. 8 is a schematic showing one embodiment of uni-directional active device drivers shown above in FIGS. 2–7 employing a CMOS circuit in accordance with the present invention.

Referring to FIG. 8, one embodiment of the active device drivers, discussed above, is a tri-state buffer 300 that includes a complementary CMOS inverter 302 connected to a CMOS tri-state inverter 304. The complementary CMOS inverter 302 comprises a series connection of a p-channel FET 306 and an n-channel FET 308. Specifically, the drain of the p-channel FET 306 connected to the source of the n-channel FET 308, defining an output node 310. The source of the p-channel FET 306 is coupled to a supply voltage, and the drain of the n-channel FET 308 is coupled to ground. The gate of the p-channel FET 306 and gate of the n-channel FET 308 are connected in common, defining an input node 312 thereat.

The CMOS tri-state inverter 304 comprises of a pair of series connected pull-up transistors 314 and 316 connected in series with a pair of series connected pull-down transistors 318 and 320. The pull-up transistors 312 and 314 are typically p-channel FETs. The pull-down transistor 316 and 318 are typically n-channel FETs. The source of the p-channel FET 314 is coupled to a supply voltage Vs, and the drain of the p-channel FET 314 is connected to the source of the p-channel FET 316. The drain of p-channel FET 316 is connected to the source of the n-channel FET 318, which defines a data output "Y" of the tri-state buffer 300. The drain of the n-channel FET 320 is coupled to a reference voltage $V_R$, typically ground, and the source is connected to the drain of the n-channel FET 318. The gates of the p-channel FET 316 and the n-channel FET 318 are connected in common, which defines a data input "A" of the tri-state buffer 300. The gate of n-channel FET 320 is connected to the input node 312 of the complementary CMOS inverter 302, and defines the control input "E" of the tri-state buffer 300.

In operation, the tri-state buffer 300 has a high impedance, Z, the data output "Y" when a logical "0" is present at the control input "E", i.e., disabled. A logical "0" is present at the data output "Y" when a logical "1" is present at both the control input "E" and the data input "A". A logical 1 is present when a logical "1" is present on the control input "E" and a logical "0" is present at the data input "A". In this fashion, tri-state buffer 300 functions as an inverting buffer having three operational states. The operational inputs and outputs are summarized as follows:

TABLE I

| E | A | Y |
|---|---|---|
| 0 | 0 | Z |
| 0 | 1 | Z |
| 1 | 0 | 1 |
| 1 | 1 | 0 |

Figure 9:
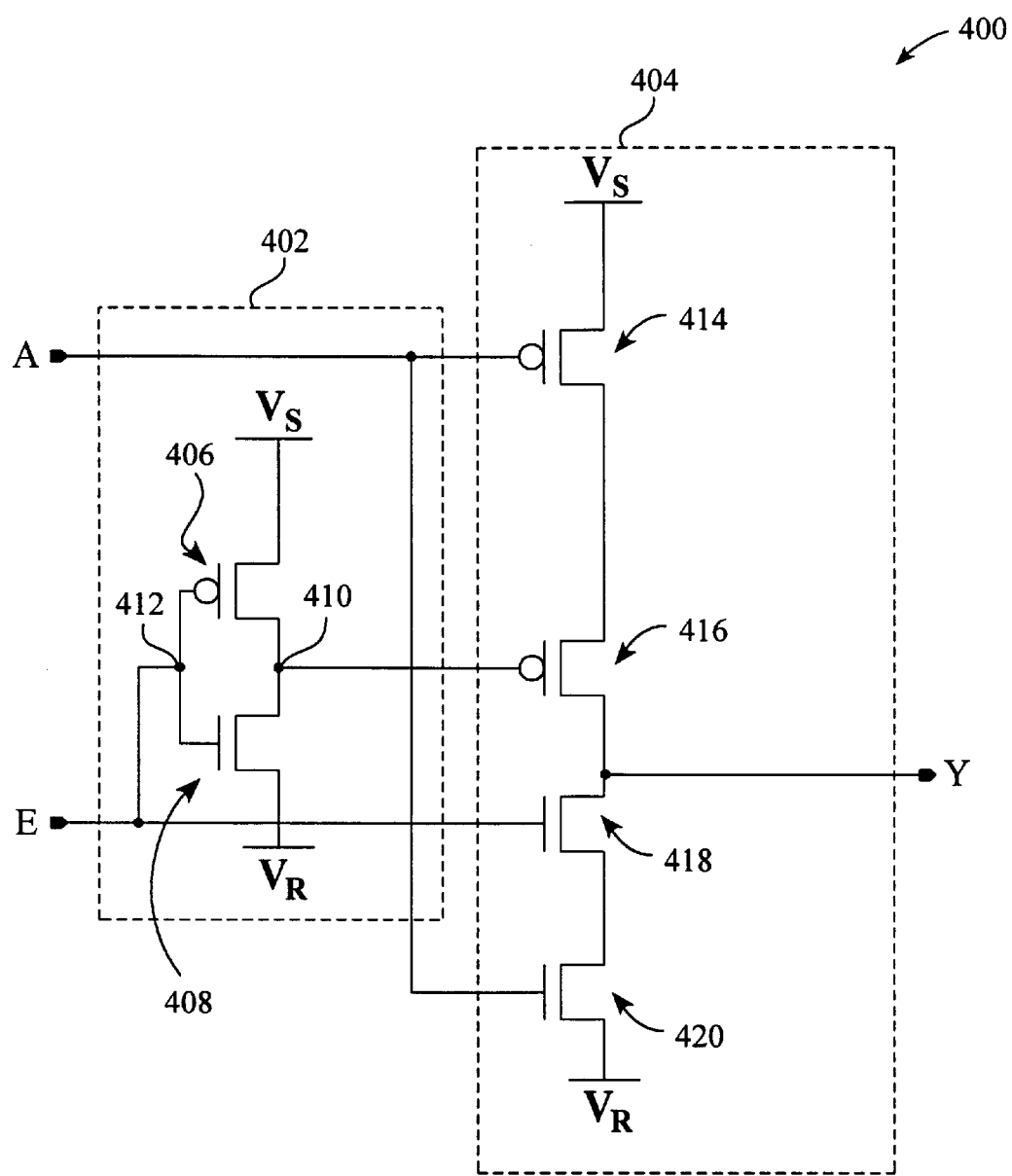
FIG. 9 is a schematic showing an alternate embodiment of the unidirectional active device drivers, shown above in FIGS. 2–7, employing a CMOS circuit in accordance with the present invention.

Referring to FIG. 9, an alternative embodiment of the tri-state buffer 400 comprises a complementary CMOS inverter 402 connected to a CMOS tri-state inverter 404. The complementary CMOS inverter 402 and the tri-state inverter 404 include a plurality of FETs 406, 408, 414, 416, 418 and 420. FETs 406, 408, 414, 416, 418 and 420 are identical to FETs 306, 308, 314, 316, 318 and 320, respectively, discussed above with respect to FIG. 8 which are connected in substantially the same manner, excepting connections of the control input "E", the data input "A" and the data output "Y". Specifically, as shown in FIG. 9, the gates of the p-channel FET 414 and the n-channel FET 420 are connected in common defining the data input "A". The gate of the n-channel FET 418 is connected to the input node 412 of the complementary CMOS inverter 402, defining the control input "E" thereat. The output node 410 of the complementary CMOS inverter 402 is connected to the gate of p-channel FET 416. The inputs and outputs shown above in Table I are representative of the operation of tri-state buffer 400.

Referring to both FIGS. 8 and 9, the tri-state buffer 400 increases the operational speed of a FPGA by reducing the capacitive load of the conductors associated with the tri-state buffer 400. Specifically, it is well known that parasitic capacitance, such as gate to channel capacitance, source and drain diffusion capacitance and gate to bulk capacitance, associated with FETs loads signal paths coupled to the FET. As the junctions of the FETs become shallower and the signal paths associated with FPGAs become shorter, the diffusion capacitance becomes the dominant contributor to capacitive loading of the signal paths. It was discovered, however, when the buffer is in the high impedance state, i.e., control input "E" is at a logical 0, the n-channel FET 318 and p-channel FET 316 allowed conduction between the source and drains thereof, i.e., the FETs 316 and 318 were "ON". This resulted in the data output "Y" being loaded with the diffusion capacitance associated with the FETs 318 and 316, as well as the diffusion capacitance associated with FETs 314 and 320. Loading of the output "Y", in this manner produces a delay in a signal propagating along a conductor which is coupled to the output "Y".

Tri-state buffer 400 reduces the aforementioned propagation delay by reducing the loading of the output "Y". Specifically, the gates of p-channel FET 416 and n-channel 418 FET are turned "OFF" when the tri-state buffer 400 is in the high impedance state. This is accomplished by having the control input "E" coupled to the gate of n-channel FET 418, and the output of complementary CMOS inverter 402 connected to the gate of p-channel FET 416. For example, in the high impedance state, a logical 0 is present on the control input "E". The signal on the control input "E" is sensed by the gate of the n-channel FET 418, turning the same "OFF". The signal on the control input "E" is also sensed by the input node 412 of the complementary CMOS inverter 402. In response to the logical 0, the complementary CMOS inverter produces a logical 1 at the output node 410. The signal present on the output node 410 is sensed by the gate of the p-channel FET 416, turning the same "OFF". In this fashion, when the tri-state buffer 400 is in the "OFF" state, no current flows through the p-channel FET 416 and the n-channel FET 418. This reduces the loading of the "Y" output by the diffusion capacitance associated with FETs 414, 416, 418 and 420.

Figure 10:
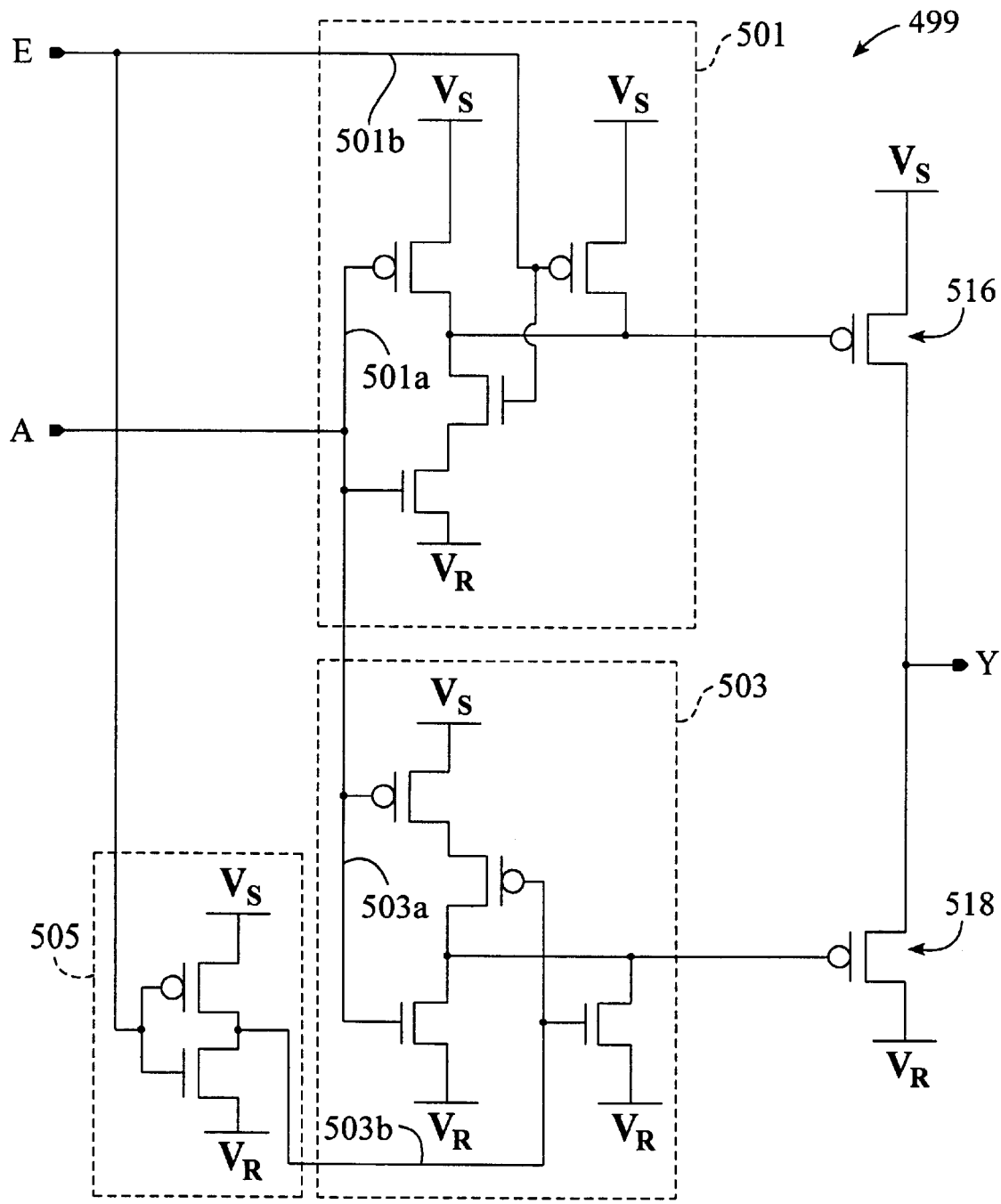
FIG. 10 is a schematic showing a first embodiment of a non-inverting unidirectional active device driver which may be employed in the circuits discussed above in FIGS. 2–7.

Referring to FIG. 10, a two-stage tri-state buffer 499 is shown which could be used as an alternative embodiment of the active device drivers discussed above. The two-stage tri-state buffer 499 is non-inverting and includes a two input NAND gate 501, a two input NOR gate 503, a complementary CMOS inverter and a p-channel FET 516 connected in series with an n-channel FET 518. One input 501a of the NAND gate 501 is connected to one input 503a of the NOR gate 503, which defines the data input "A" of the tri-state buffer 499. The remaining input 501b of the NAND gate 501 defines the control input "E" of the tri-state buffer 499 and is connected to the remaining input 503b of the NOR gate 503 through the complementary CMOS inverter 505. The output of the NAND gate is connected to the gate of the p-channel FET 516, and the output of the NOR gate is connected to the gate of the n-channel FET 518. The source of the p-channel FET is connected to a supply voltage $V_S$, and the drain is connected to the source of the n-channel FET 518, defining the output "Y" of the two-stage tri-state buffer 499. The drain of the n-channel FET 518 is connected to a reference voltage $V_R$. In operation, the truth table for the two-stage tri-state buffer 499 is as follows.

TABLE II

| E | A | Y |
|---|---|---|
| 0 | 0 | Z |
| 0 | 1 | Z |
| 1 | 0 | 0 |
| 1 | 1 | 1 |

Figure 11:
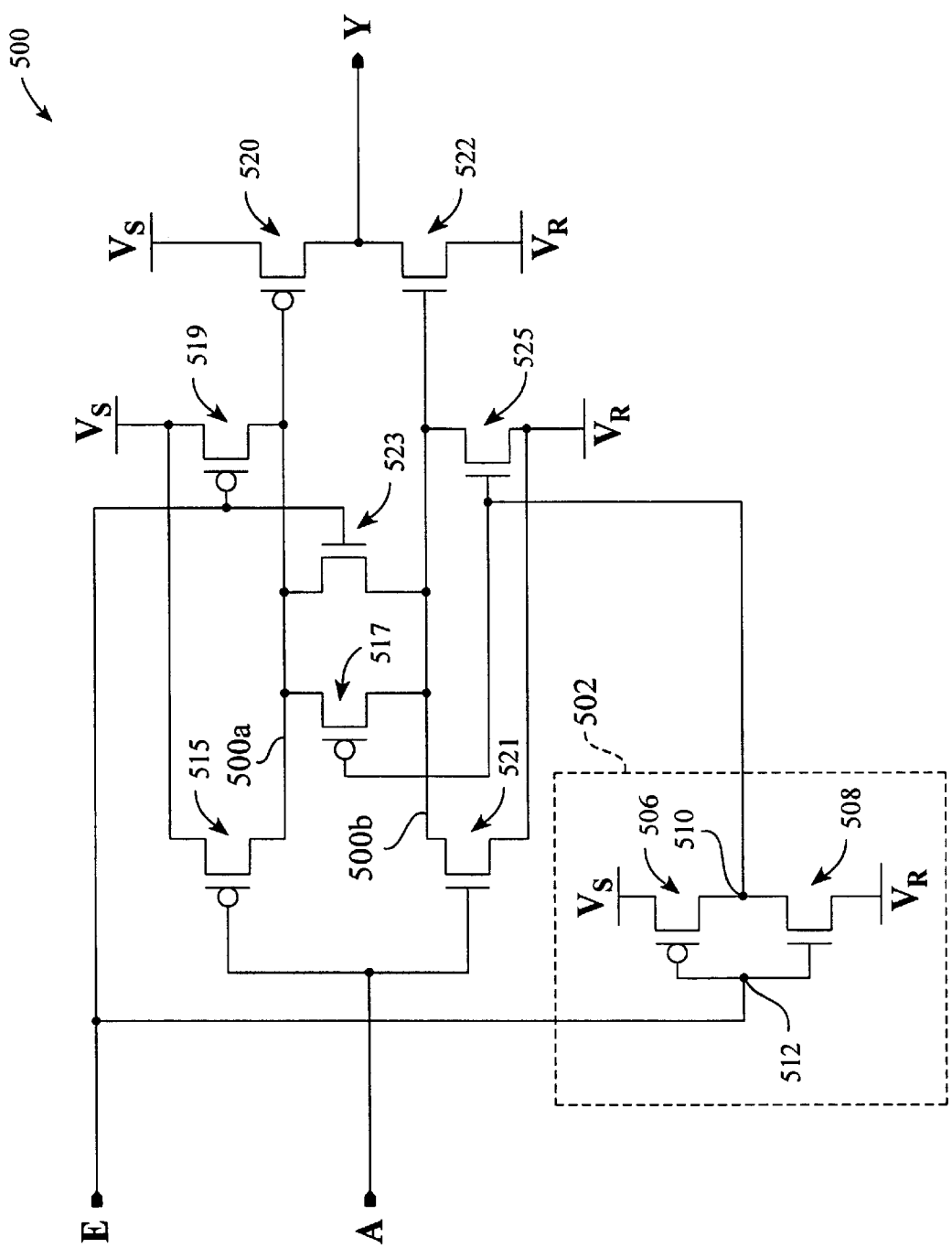
FIG. 11 is a schematic showing a second embodiment of a non-inverting unidirectional active device driver which may be employed in the circuits discussed above in FIGS. 2–7.

Referring to FIG. 11, another embodiment of a non-inverting two-stage tri-state buffer circuit 500 is shown which could be used in place of the active device drivers discussed above. The tri-state buffer circuit 500 includes three p-channel FETs 515, 517, 519 and three n-channel FETs, 521, 523 and 525. The p-channel FETs 515 and 519 are connected in parallel. The n-channel FETs 521 and 525 are connected in parallel, with the gate of p-channel FET 515 connected in common with the gate of n-channel FET 521, defining a data input "A" of the tri-state buffer 500. The p-channel FET 517 is connected in parallel with the n-channel FET 523, with the gate of the p-channel FET 517 connected in common with the gate of the n-channel FET 525. The gates of p-channel FET 519 and n-channel FET 523 are also connected in common. The drains of p-channel FETs 515 and 519 are connected to the drains of both the p-channel FET 517 and the n-channel FET 523. The sources of the n-channel FETs 521 and 525 are connected to the drains of both the p-channel FET 517 and the n-channel FET 523. The source of p-channel FET 519 and 515 are connected to supply voltage VS and the drain of n-channel FET 525 and 521 are connected to a reference voltage $V_R$.

The inverter 502 is a complementary CMOS inverter comprising a p-channel FET 506 and n-channel FET 508, connected together as discussed above with respect to complementary CMOS inverter 302 and 402, shown in FIGS. 8 and 9, respectively. The output node 510 of the complimentary CMOS inverter 502 is connected to the gates of both p-channel FET 517 and n-channel FET 525. The input node of the complimentary CMOS inverter 502 is connected in common with the gates of both p-channel FET 519 and n-channel FET 523, defining the control input "E" of the two-stage tri-state buffer 500. The gate of the p-channel FET 520 is connected to the drains of p-channel FETs 515 and 519, and the sources of both p-channel FET 517 and n-channel FET 523. The gate of n-channel FET 522 is connected to the sources of n-channel FETs 521 and 525 and the drains of both p-channel FET 517 and n-channel FET 523.

An advantage with the two-stage tri-state buffer 500, when compared to the non-inverting tri-state buffer 499 of FIG. 10, if that tri-state buffer 500 of FIG. 11 may be formed from a reduced number of FETs. This reduces the capacitive loading at the data input "A" and the control input "E", because there are less gates attached thereto. In addition, the FETs may be formed from substantially smaller dimensions without sacrificing signal transmission speed, which also reduces the capacitive loading by the tri-state buffer 500. This is accomplished by forming FETs, associated with the control signal path, with smaller channel regions than transistors associated with the data signal path. To that end, the p-channel FETs 506 and 519 and n-channel FETs 508 and 525 have channel regions which are substantially smaller than the channel regions of p-channel FETs 515, 517, and 520 and n-channel FETs 521, 522, and 523. With this structure, the two-stage tri-state buffer may be formed with substantially smaller dimensions than the tri-state buffers described above which reduces the channel capacitance which loads the output "Y". This reduces the load on a previous stage.

Moreover, the structure of tri-state buffer 500 substantially reduces dynamic power dissipation. Specifically, during transition from either a logical "0" to a logical "1", or vice versa, the current path through p-channel FET 520 and n-channel FET 522 may appear as a short circuit, referred to herein as crowbar effect. This occurs due to both FETs conducting simultaneously while transitioning between logic states. However, this is avoided by delaying the transition of the voltage level on voltage rails 500a and 500b. For example, were the data input to transition between a logical "1" to a logical "0", the voltage present a low voltage would be present on voltage rail 500b before it would be present on voltage rail 500a. This would result in n-channel FET 522 being "turned off" before p-channel FET 520 is "turned on", thereby avoiding the aforementioned crowbar effect. This results from a delay introduced in the current propagation between voltage rails 500a and 500b brought about by n-channel FET 523 and p-channel FET 517. In a similar fashion, were the data input to transition between a logical "0" to a logical "1", a high voltage would be present on voltage rail 500a before it would be present on voltage rail 500b, for the foregoing reasons. This would result in p-channel FET 520 being "turned off" before n-channel FET 522 is "turned on", again avoiding the aforementioned crowbar effect.

Figure 12:
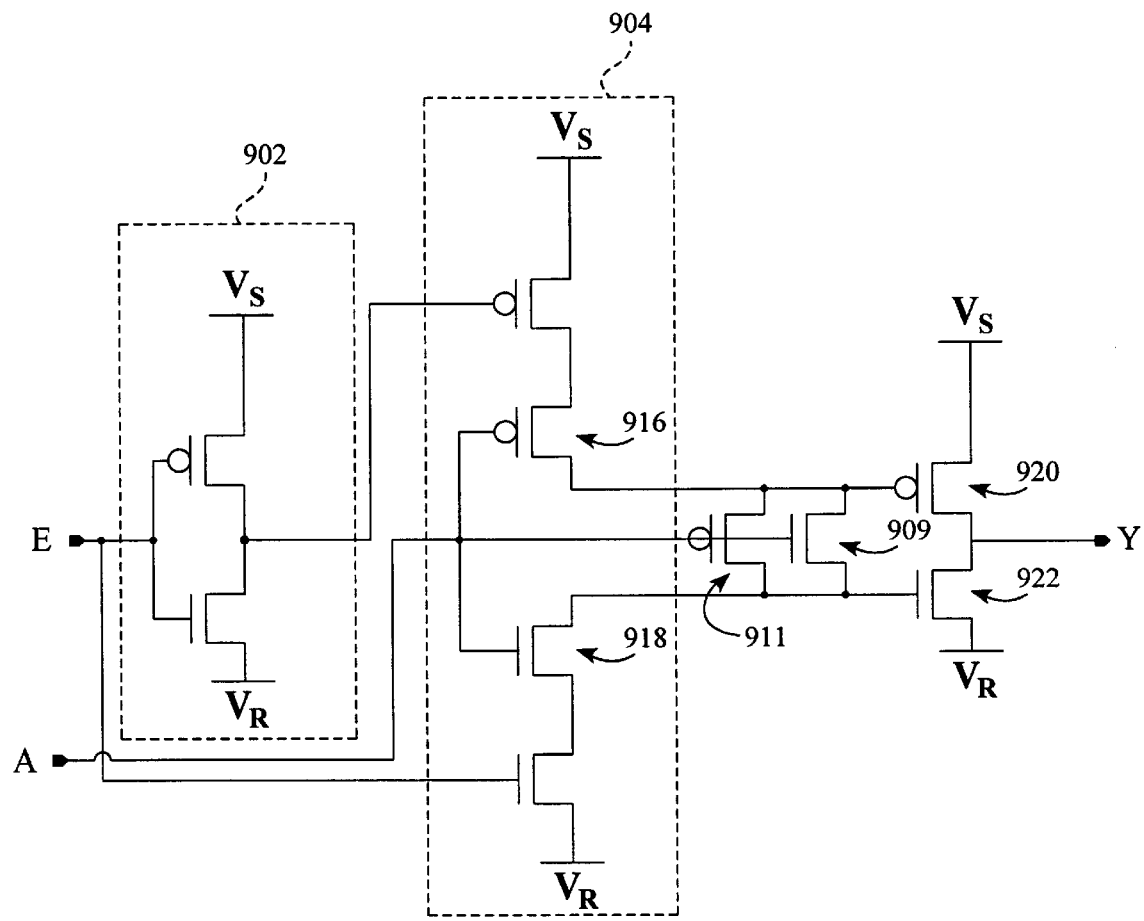
FIG. 12 is a schematic showing a third embodiment of a non-inverting unidirectional active device driver which may be employed in the circuits discussed above in FIGS. 2–7.

Referring to FIG. 12, another embodiment of a non-inverting tri-state buffer circuit 900 is shown which could be used in place of the active device drivers discussed above. The tri-state buffer circuit 900 a complementary CMOS inverter 902 connected to a CMOS tri-state inverter 904, as discussed above with respect to FIG. 8. An n-channel FET 909 and a p-channel FET 911 are each connected in parallel between the drain of the second pull-up transistor 916 and the source of the second pull-down transistor 918. The gates of both the p-channel FET 911 and the n-channel FET 909 are connected in common with the gates of the second pull-up transistor 916 and the second pull-down transistor 918. An output driver 913 consists of a p-channel FET 920 connected in series with an n-channel FET 922. The drain of p-channel FET 920 is connected to the source of n-channel FET 922 defining the output "Y". The gate of the p-channel FET 920 is connected in common with the sources of both n-channel FET 909 and p-channel FET 911, as well as the drain of second pull-up transistor 916. The gate of the n-channel FET 922 is connected in common with the sources of both n-channel FET 909 and p-channel FET 911, as well as the drain of second pull-up transistor 916. The source of the p-channel FET 920 is connected to the voltage source $V_S$, and the drain of the n-channel FET 922 is connected to the reference voltage $V_R$. Both the n-channel FET 909 and the p-channel FET 911 reduce the crowbar effect in a manner similar to that discussed above with respect to n-channel FET 523 and p-channel FET 517 shown in FIG. 11.

Figure 13:
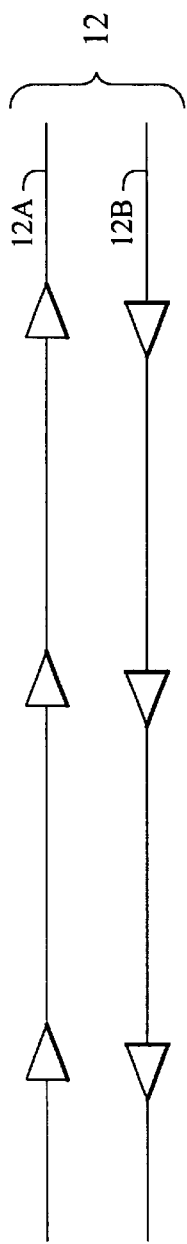
FIG. 13 illustrates two unidirectional bus lines.
Figure 14:
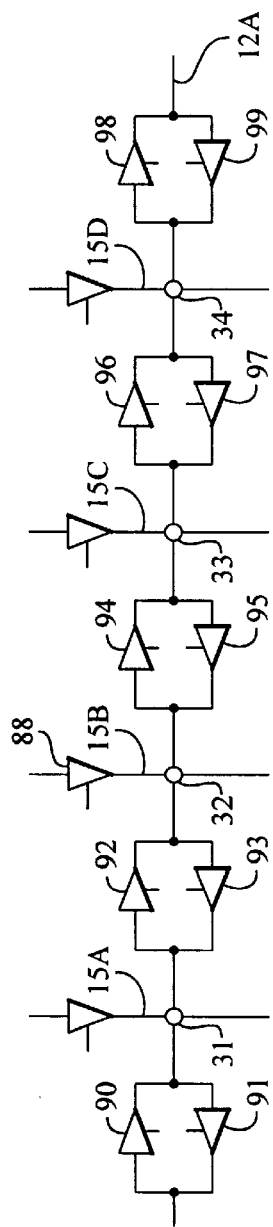
FIG. 14 illustrates a bus line which can be made unidirectional in either direction using bidirectional active device drivers.
Figure 15:
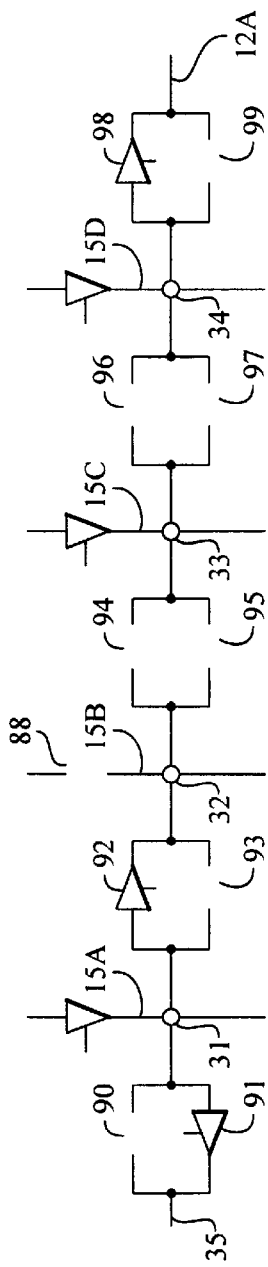
FIG. 15 illustrates a bus line which has been segmented using bidirectional active device drivers.

FIGS. 13, 14, and 15 illustrate a refinement in the routing structure of our system. In one embodiment, the system buses are unidirectional. Absent other modifications, this imposes a requirement on the system, if it to have maximum flexibility, buses should be provided for each direction along which a signal is to propagate. For example, input bus 12 would be required to have some lines with active driver circuits to allow signal propagation to the east, and some lines wit circuits to allow signal propagation to the west. FIG. 13 illustrates an example bidirectional propagation of signals employing of active device drivers on bus lines, with bus line 12a propagating signals in one direction, and bus line 12b propagating signals in an opposing direction.

FIG. 14 shows a modification of this technique in which driver circuits are used to segment the bus line 12a into smaller regions, thereby allowing portions of the line to be used in each direction. As shown in FIG. 14, some of the output buses 15a, 15b, 15c, and 15d cross the input bus 12a at junction locations 31, 32, 33, and 34. Each of these junction locations will use the connection structure shown in FIG. 7 to provide a possible interconnection between the output bus line 15 and the input bus line 12. Unlike the structure of FIG. 13, however, a pair of driver circuits is provided between each junction. For example, drivers 92 and 93 are provided between junctions 31 and 32. By programming one of the driver circuits ON and the other one OFF, signals can be propagated between nodes 31 and 32 in either direction.

In FIG. 15, assume that the signal on line 15a is to be communicated both to the left and right on input bus 12a. To achieve this, circuits 91 and 92 are programmed ON, and circuits 90 and 93 are programmed OFF. This allows the signal on line 15a to be supplied to nodes 35 and 32. For illustration, circuit 88 has been programmed OFF to show that the same bidirectional capability may be provided in the output lines, as well as the input lines.

Active device driver circuits 94, 95, 96, and 97 have all been programmed OFF to isolate node 32 from node 34. Of course, the node could be isolated by programming only one pair 94 and 95, or 96 and 97 OFF. To enable the signal on output bus 15d to be supplied to the right on input line 12a, circuit 98 has been programmed ON and circuit 99 OFF.

Figure 16:
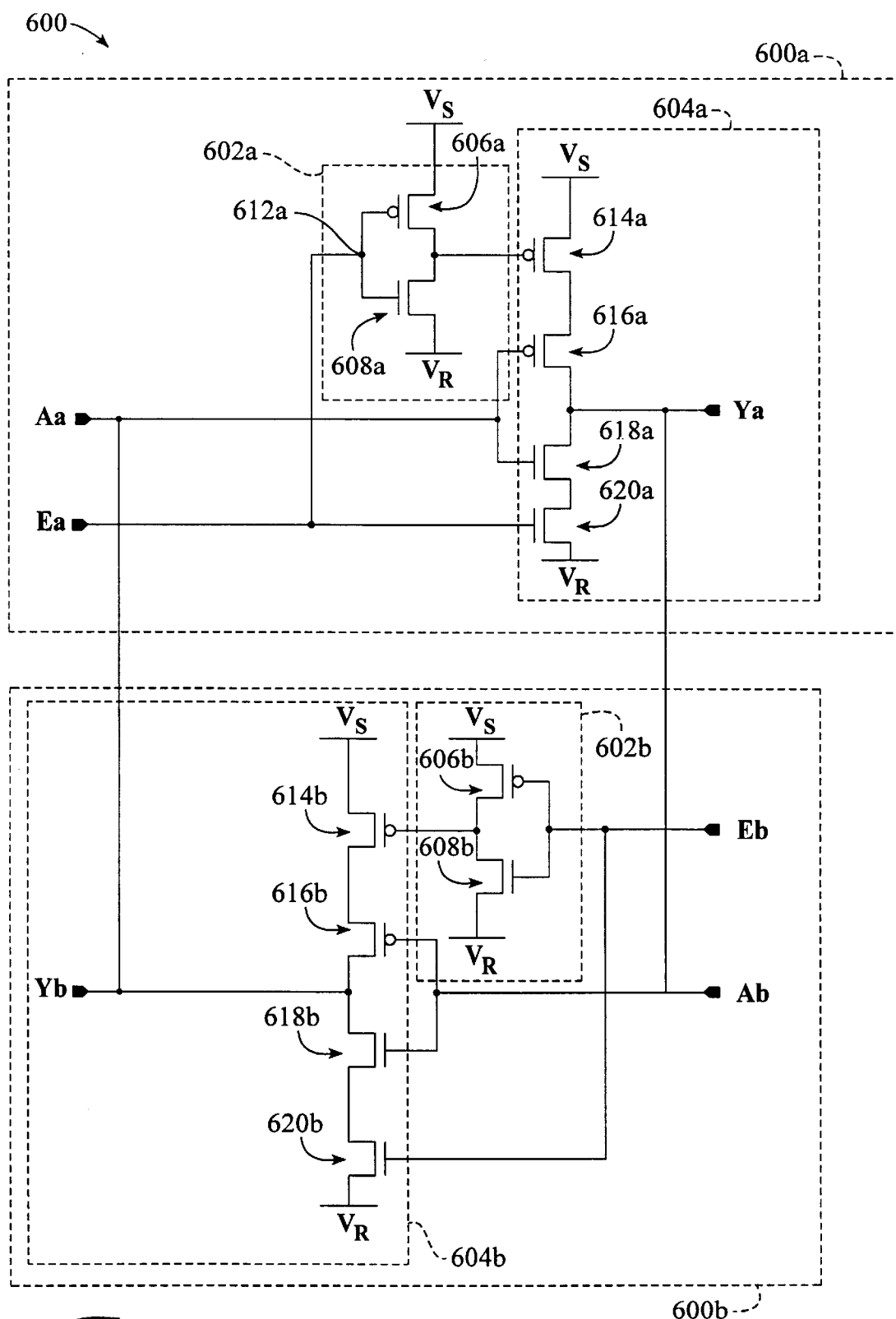
FIG. 16 is a schematic showing one embodiment of the bidirectional active device drivers above in FIGS. 14 and 15 employing a CMOS circuit in accordance with the present invention.

The active device driver circuits mentioned above in FIGS. 14 and 15 may be employed using a bidirectional tri-state buffer 600, shown in FIG. 16. Bidirectional tri-state buffer 600 comprises two tri-state buffers 300, shown above in FIG. 8, connected so that the input of one is coupled to the output of the other. In this manner, elements 302, 304, 306, 308, 310, 312, 314, 316, 318 and 320 of FIG. 8 correspond to elements, 602a and 602b, 604a and 604b, 606a and 606b, 608a and 608b, 610a and 610b, 612a and 612b, 614a and 614b, 616a and 616b, 618a and 618b, and both 620a and 620b, respectively, of FIG. 16. The output "$Y_a$" of tri-state buffer 600a is connected to the input $A_b$ of tri-state buffer 600b, and the input "$A_a$" of tri-state buffer 600b is connected to the output of "$Y_b$" of tri-state buffer 600a. With this configuration only one of the tri-state buffers 600a and 600b may be activated at a time.

Figure 17:
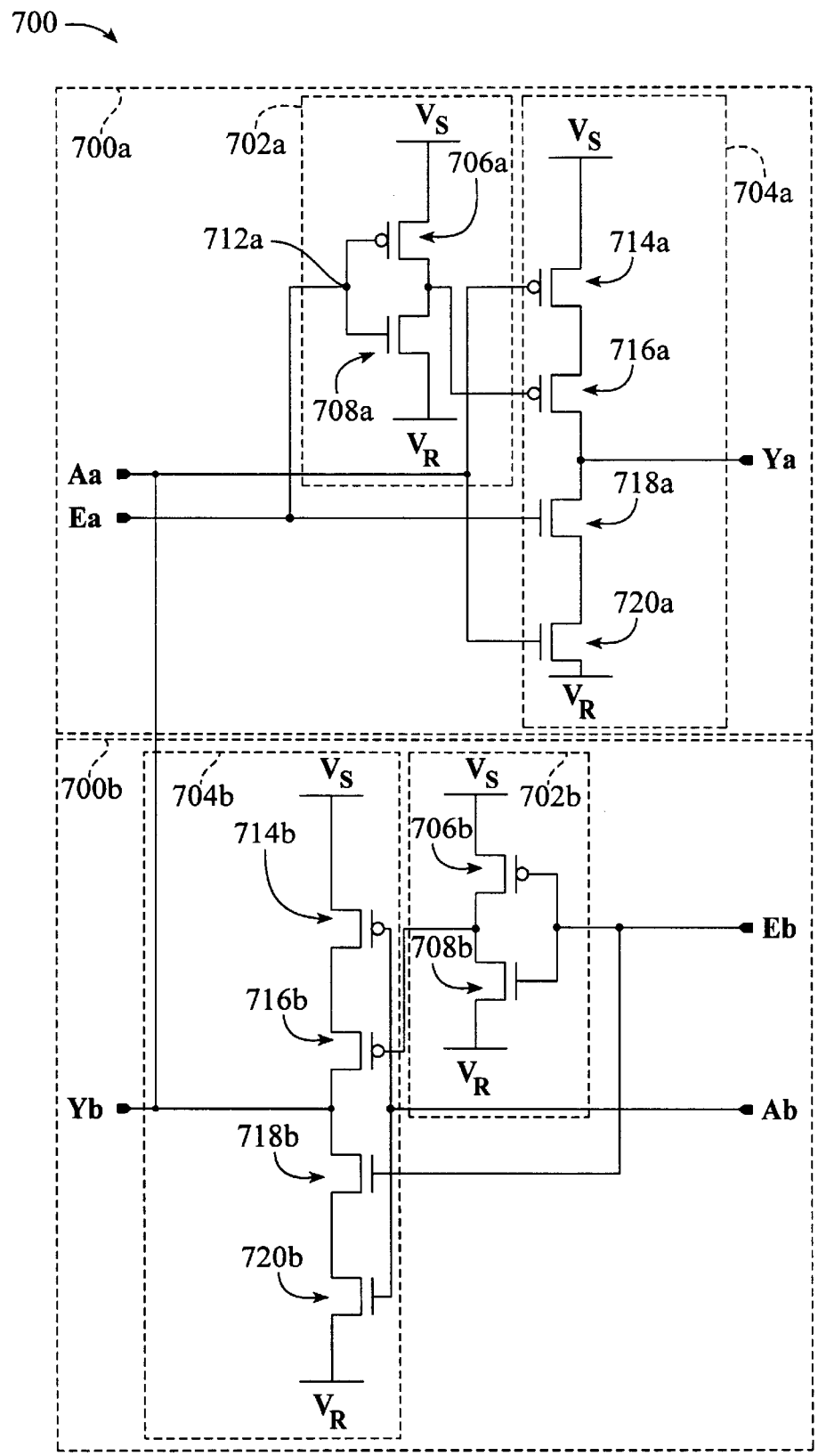
FIG. 17 is a schematic showing an alternate embodiment of the bidirectional active device drivers, shown above in FIGS. 14 and 15, employing a CMOS circuit in accordance with the present invention.

Referring to FIG. 17, in an alternative embodiment, the driver circuits described above in FIGS. 14 and 15 may be employed using a bidirectional tri-state buffer 700 that comprises first and second two tri-state buffers 700a and 700b. Each of the tri-state buffers 700a and 700b is identical to the tri-state buffer 400, shown above in FIG. 9 and connected so that the input of one is coupled to the output of the other. In this manner, elements 402, 404, 406, 408, 410, 412, 414, 416, 418 and 420 of FIG. 9 correspond to elements, 702a and 702b, 704a and 704b, 706a and 706b, 708a and 708b, 710a and 710b, 712a and 712b, 714a and 714b, 716a and 716b, 718a and 718b, and both 720a and 720b, respectively of FIG. 16. The output "$Y_a$" of tri-state buffer 600a is connected to the input $A_b$ of tri-state buffer 700b, and the input "$A_b$" of tri-state buffer 700b is connected to the output of "$Y_a$" of tri-state buffer 700a. With this configuration only one of the tri-state buffers 700a and 700b may be activated at any given time.

Figure 18:
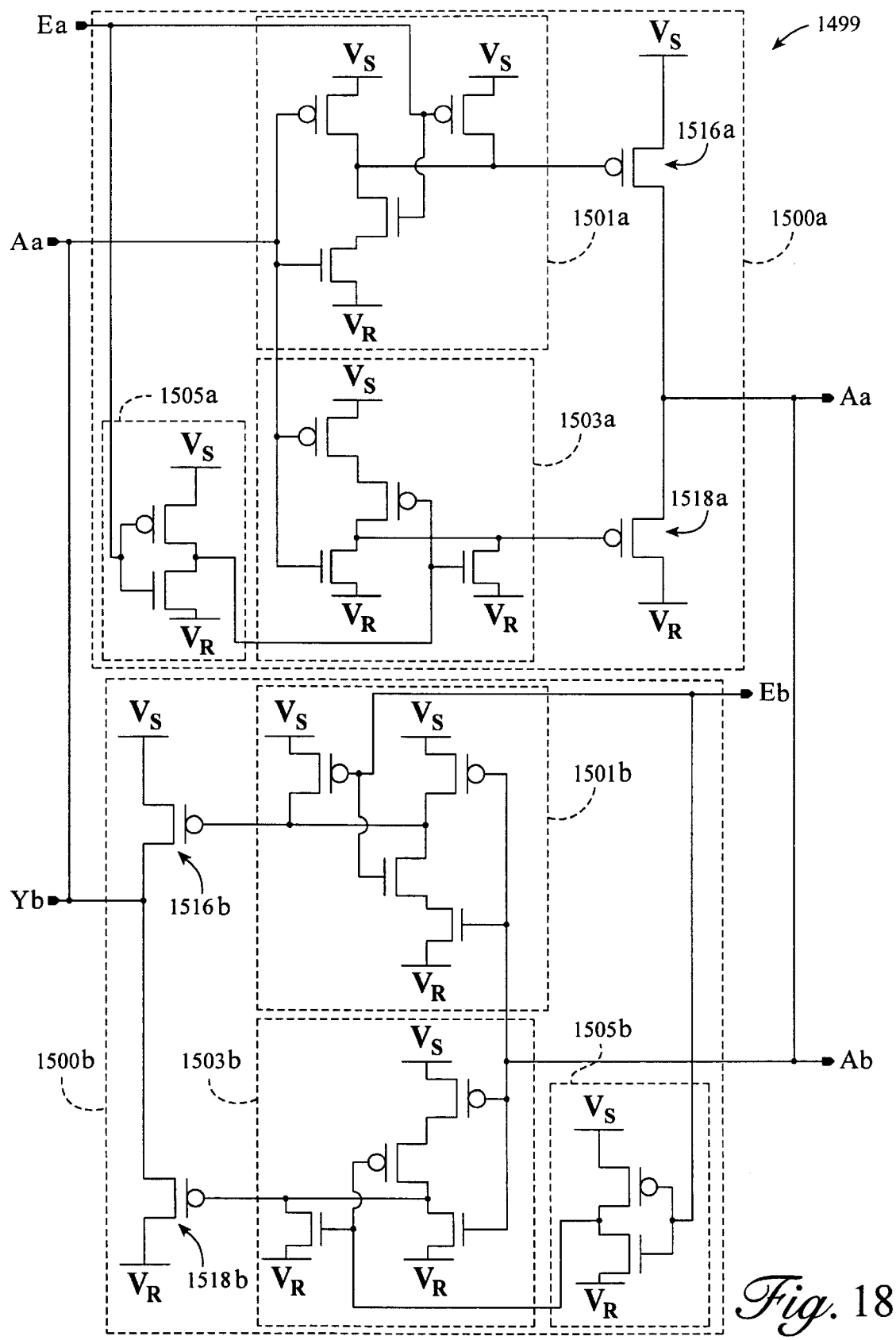
FIG. 18 is a schematic showing an alternate embodiment of the bidirectional active device drivers, shown above in FIGS. 14 and 15, employing a CMOS circuit in accordance with a first alternate embodiment of the present invention.

Referring to FIG. 18, a non-inverting bidirectional tri-state buffer 1499 may be employed as the driver circuits described above in FIGS. 14 and 15. The non-inverting bidirectional tri-state buffer 1499 of FIG. 18 includes first and second two-stage tri-state buffers 1500a and 1500b. Each of the tri-state buffers 1500a and 1500b is identical to the tri-state buffer 499, shown above in FIG. 10 and connected so that the input of one is coupled to the output of the other. In this manner, elements 501, 503, 505, 516 and 518, of FIG. 10 correspond to elements, 1501a and 1501b, 1503a and 1503b, 1505a and 1505b, 1516a and 1516b, and both 1518a and 1518b, respectively, of FIG. 18.

Figure 19:
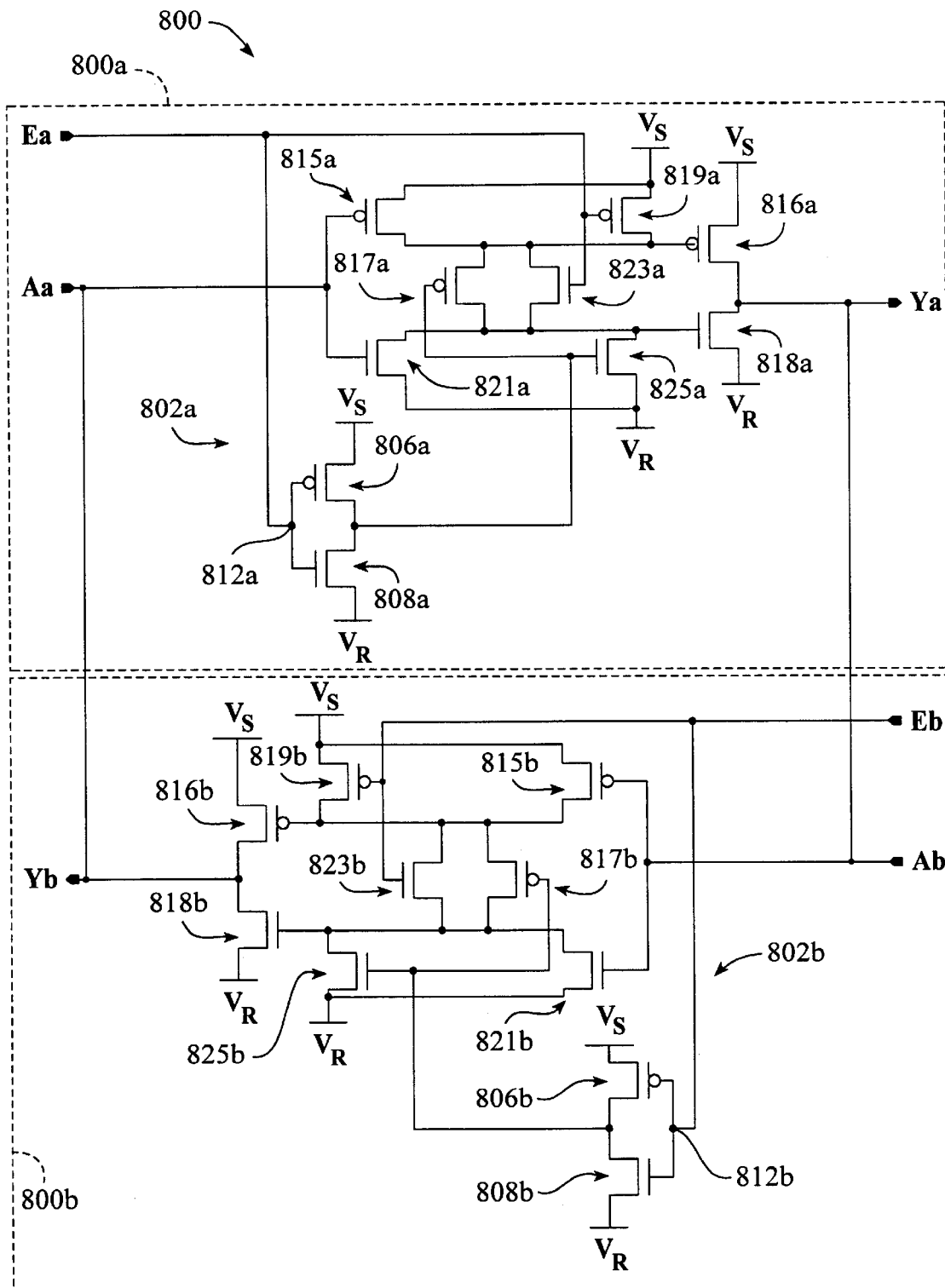
FIG. 19 is a schematic showing an alternate embodiment of the bidirectional active device drivers, shown above in FIGS. 14 and 15, employing a CMOS circuit in accordance with a second alternate embodiment of the present invention.

Referring to FIG. 19, a bidirectional two-stage tri-state buffer 800 may be employed as the driver circuits described above in FIGS. 14 and 15. The bidirectional two-stage tri-state buffer 800 of FIG. 19 includes a first and second two-stage tri-state buffers 800a and 800b. Each of the tri-state buffers 800a and 800b is identical to the tri-state buffer 500, shown above in FIG. 11 and connected so that the input of one is coupled to the output of the other. In this manner, elements 502, 506, 508, 510, 512, 515, 517, 519, 521, 523, and 525, of FIG. 11 correspond to elements, 802a and 802b, 806a and 806b, 808a and 808b, 810a and 810b, 812a and 812b, 815a and 815b, 819a and 819b, 821a and 821b, 823a and 823b, and both 825a and 825b, respectively, of FIG. 19.

Figure 20:
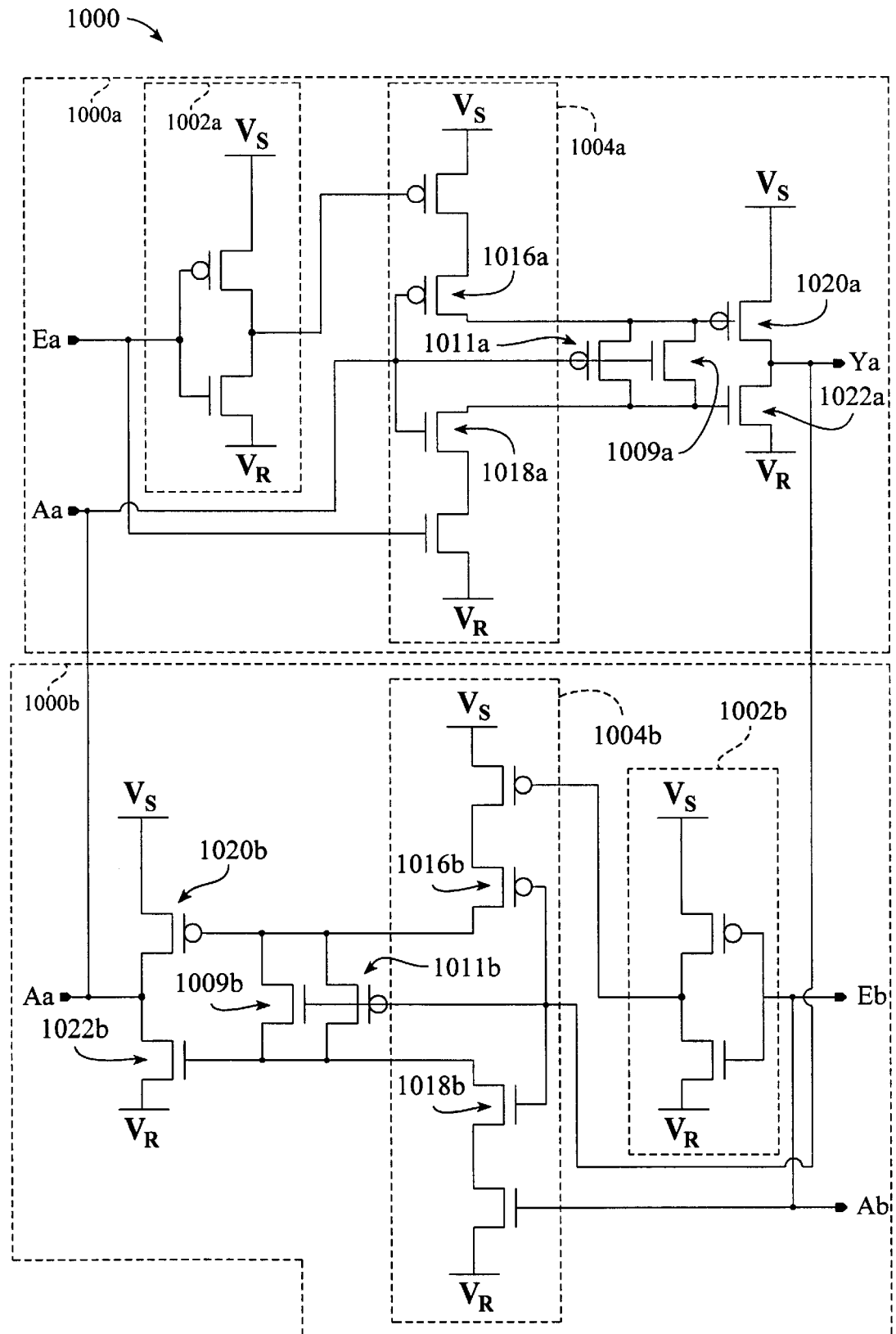
FIG. 20 is a schematic showing an alternate embodiment of the bidirectional active device drivers, shown above in FIGS. 14 and 15, employing a CMOS circuit in accordance with a third alternate embodiment of the present invention.

Referring to FIG. 20 an alternative embodiment of a non-inverting bidirectional active device driver 1000 may be employed as the driver circuits described above in FIGS. 14 and 15. The bidirectional two-stage tri-state buffer 1000 of FIG. 20 includes a first and second two-stage tri-state buffers 1000a and 1000b. Each of the tri-state buffers 1000a and 1000b is identical to non-inverting the tri-state buffer 900, shown above in FIG. 12 and connected so that the input of one is coupled to the output of the other. In this manner, elements 900, 902, 904, 909, 911, 916, 918, 920 and 922 of FIG. 12 correspond to elements, 1000a and 1000b, 1002a and 1002b, 1004a and 1004b, 1009a and 1009b, 1011a and 1011b, 1016a and 1016b, 1018a and 1018b, 1020a and 1020b, and both 1022a and 1022b, respectively, of FIG. 20.

Figure 21:
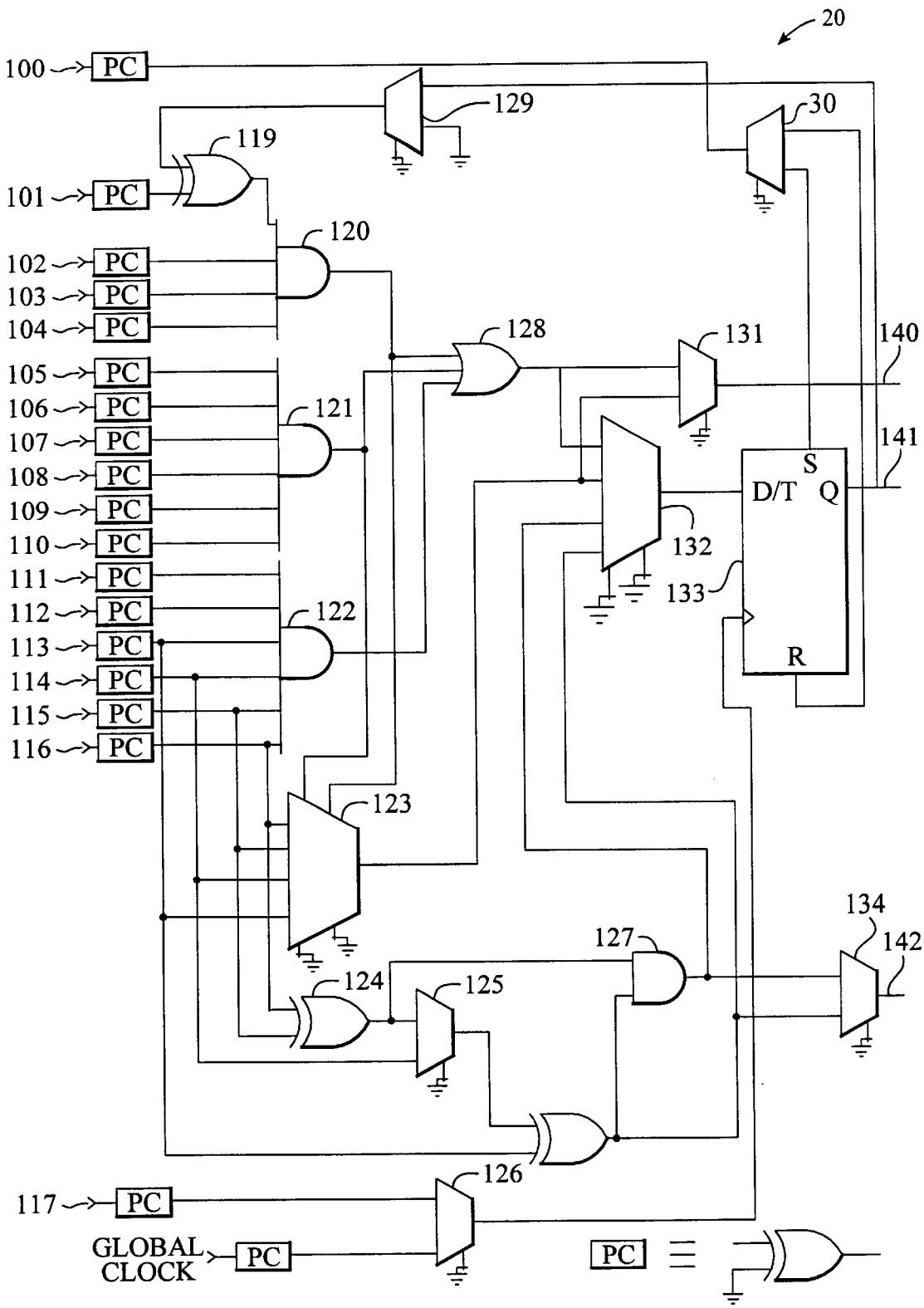
FIG. 21 is a schematic drawing of the circuitry of one logic cell.

FIG. 21 is a schematic diagram of a preferred embodiment of the logic cell employed in our system. As described in conjunction with FIG. 1, the logic cells are used to perform the logical operations on the input signals from the input buses, and place the resulting output signals on the output buses for use by other cells, or to be supplied by the integrated circuit to other electronic apparatus.

As shown in FIG. 21, in the preferred embodiment a logic cell 20 may receive up to 18 input signals 100, 101, . . . , 117, and provide in response three output signals 140, 141, and 142. By virtue of the exclusive OR gate 119, the AND gates 120, 121, and 122, and the OR gate 128, combinational logic may be performed. The D-type flip-flop 133 provides the capability of performing sequential logic on the input signals, or on the output signals from the combinational logic, depending upon the state of multiplexer 132.

In FIG. 21 each input signal is supplied through a polarity control (PC) circuit formed using an exclusive OR gate, as shown in the lower right-hand portion of the figure. The rectangular symbol with "PC" inside it designates this polarity control connection, and is used to simplify the drawing.

The particular logic cell depicted allows for global or local clock options, enabling the clock rate of the logic cell to differ from the clock rate of the overall integrated circuit. By virtue of the programmable interconnections, unused circuits consume no power, yet polarity control is provided on all inputs.

The particular logic cell depicted is optimized to implement, and function such as a full adder with carry, a two-bit comparator, or a four-input multiplexer. In addition, the logic can readily serve as a single stage of a preloadable left/right shift register, or as one stage of a synchronous four-bit preloadable up/down counter.

Figure 22:
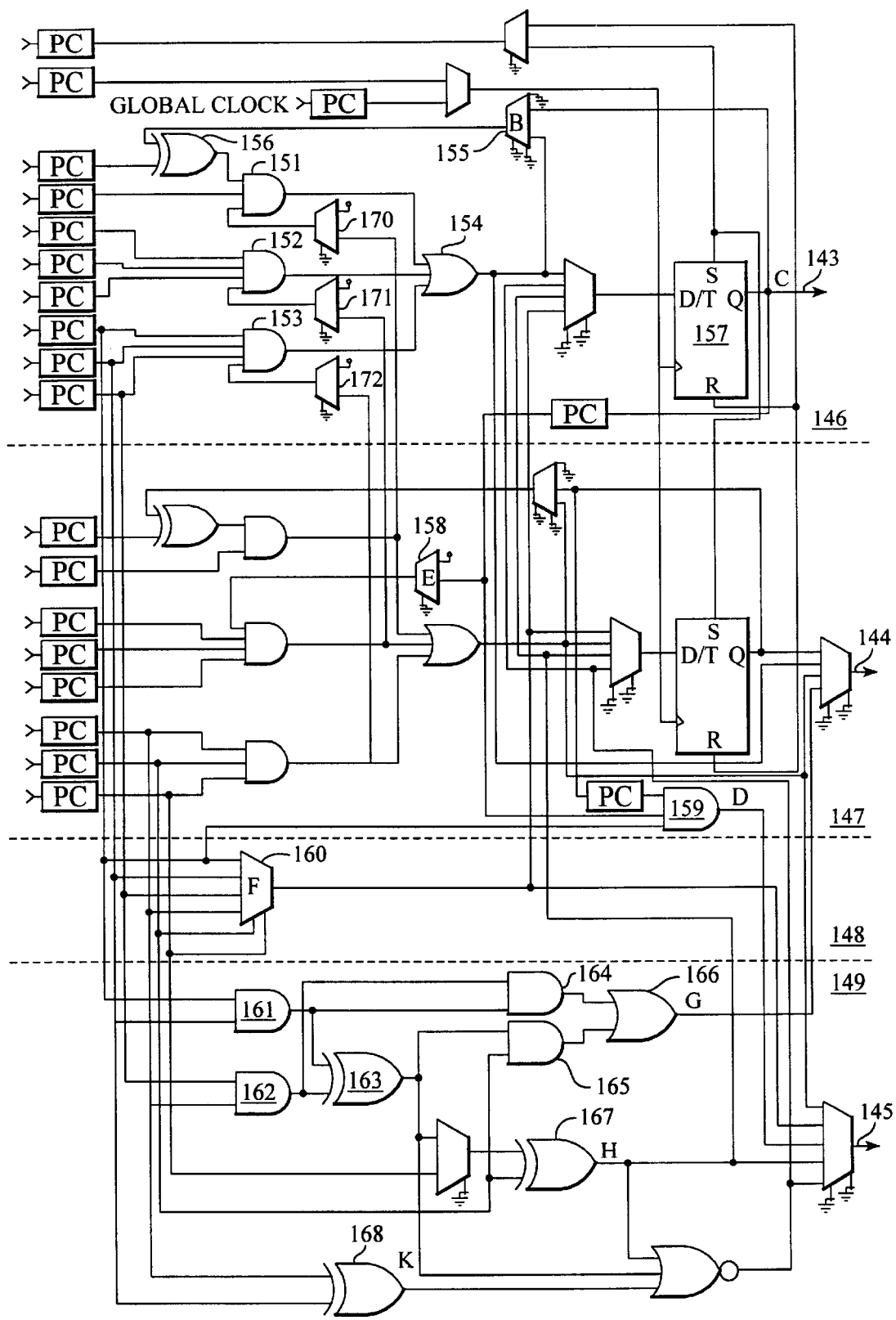
FIG. 22 is a detailed circuit schematic of a preferred embodiment of the logic block employed in FIG. 1.

FIG. 22 is a detailed circuit schematic of a preferred embodiment of the logic block employed in the programmable logic architecture of this invention. The logic block schematic corresponds to a preferred embodiment of the logic block 20 shown in block diagram form in FIG. 1. Generally, the logic block is coupled to potentially, depending on the programming, receive up to eighteen input signals at the terminals along the left edge of the Figure. In response the logic block supplies up to three output signals at the terminals 143, 144, and 145 along the right edge of the Figure. For the purpose of explanation, the logic block can be considered as being divided into four sections as shown by the dashed lines extending across FIG. 22. The upper two sections 146, 147 provide high level functions, as described below. The third section 148 provides a multiplexing function, and the bottom section 149 an arithmetic and comparing function. The bottom section adder can provide a carry to the top section, or permit the comparison of three bits to detect whether all are the same.

In the upper section 146, logic gates 151, 152, 153, and 156 provide AND-OR logic to node A. Feedback from some of the gates in section 147 is permitted by the multiplexers 170, 171, 172. This enables supplying of some of the input signals directed to the section 147 to section 146, as well. Multiplexer 155 provides a feedback multiplexer, enabling, in combination with gate 156, a latch function to be provided. The feedback path from flip-flop 157 provides a load function for a counter or a shifter. The flip-flop itself provides a path for controlling data flow from the logic block to external circuitry. When the flip-flop is configured as a D-type flip-flop, it provides for shifting. When configured as a T-type flip-flop, it provides counting capability.

The second section 147 of the logic block duplicates the functionality of the upper section, and is linked to the upper section by node C through multiplexer 158 and AND gate 159. By programmable coupling the upper two sections of the logic block together, the overall logic block can provide a two-bit counter. This counter can be chained together with other counters provided by other logic blocks to make long counters. The connection at node C allows the upper unit to shift data to the lower unit.

The third section 148 of the logic block, consisting primarily of multiplexer 160, can be programmed to provide a straight multiplexing function on a subset of the input signals.

In the lower section 149 of the logic block, gates 161, 162, 163, 164, 165, 166, and 167 enable provision of a full adder with a carry bit at node G. The sum appears at node H. Gates 161 and 162 allow multiplexing, while gates 163, 168, and 167 allow comparison of three-bit quantities.

Throughout FIG. 22 small rectangles labeled PC provide polarity control on the signal, using the gate structure shown in the inset of FIG. 21. Also, as shown, each multiplexer in the logic block is connected to be controlled by one or two control bits. These can be either logical 1 or logical 0, thereby providing a one or two bit control signal to the multiplexer to enable selection of one of two, or one of four input lines to the multiplexer. The selected line is coupled to the output terminal of the multiplexer.

The logic block shown in FIG. 22 enables relatively easy construction of a set of logic functions. In contrast to the approach followed by other programmable logic device architectures, this architecture is optimized to provide various functions, rather than provide overall complete flexibility and functionality. By providing a relatively large logic block, fewer connections are required and faster overall operating speed is provided. In other architectures, the provision of numerous small logic blocks results in many interconnections among blocks, slowing overall system speed.

Although the foregoing has been a description of several embodiments of the programmable logic of our system, it should be appreciated that numerous other variations in the specific details and structures described can be implemented. Accordingly, the scope of the invention should not be determined by the description above, but rather, should be determined by the appended claims along with the full scope of equivalents thereof.

What is claimed is:

1. A circuit, comprising:

a logic cell;

a signal line extending from the logic cell; and a tri-state CMOS signal conditioning circuit coupled to the signal line, the signal conditioning circuit having three output states including a logic "0", a logic "1", and a high impedance state, the signal conditioning circuit including a data input coupled to the signal line, a control input, a data output, and an output driver having an isolator circuit, with the output driver being coupled to the control and data inputs and providing the data output, the output driver including a p-channel FET connected in series with an N-channel FET between a reference voltage and a source voltage, with the isolator circuit being coupled to selectively isolate the p-channel FET from the reference voltage, wherein the isolator circuit includes first and second serially connected pull-up transistors, first and second serially connected pull-down transistors, a third pull-up transistor, and a third pull-down transistor, each of which includes a gate, a source, and a drain, with the gate of one of the first pull-down and second pull-up transistors being connected in common with the gate of both the third pull-up and the third pull-down transistors, and the source of both the third pull-up and pull-down transistors being connected in common with the gate of the p-channel FET and the drain of the second pull-up transistor, and the drain of both the third pull-up and pull-down transistors being connected in common with the gate of the n-channel FET and the source of the first pull-down transistor.

2. A circuit, comprising:

a logic cell;

a signal line extending from the logic cell; and a tri-state CMOS signal conditioning circuit coupled to the signal line, the signal conditioning circuit having three output states including a logic "0", a logic "1", and a high impedance state, the signal conditioning circuit including a data input coupled to the signal line, a control input, a data output, and an output driver coupled to the control and data inputs and providing the data output, the output driver including a first p-channel FET connected in series with a first n-channel FET between a reference voltage and a source voltage, with the first p-channel FET and the first n-channel FET including a gate, a drain, and a source, the output driver further including a second p-channel FET and a second n-channel FET connected between the gates of the first p-channel FET and the first n-channel FET to selectively isolate the p-channel FET from the reference voltage, the output driver further including first and second serially connected pull-up transistors and first and second serially connected pull-down transistors, with each of the pull-up and pull-down transistors as well as the second p-channel and n-channel FETs having a gate, a source and a drain, with the gates of the second pull-up and first pull-down transistors being connected in common with the gates of the second p-channel and second n-channel FETs, defining the data input, the drain of the second pull-down transistor being connected to the reference voltage, the source of the first pull-up transistor being connected to the source voltage, with a complementary CMOS inverter having an input node and an output node connected so that the output node is connected to the gate of the second pull-up transistor and the input node is connected to the control input.

3. An isolator circuit for an output driver comprising a p-channel FET and an n-channel FET connected in series, comprising:

first and second serially connected pull-up transistors;

first and second serially connected pull-down transistors;

a third pull-up transistor; and a third pull-down transistor, each of which includes a gate, a source, and a drain, with the gate of one of the first pull-down and second pull-up transistors being connected in common with the gate of both the third pull-up and the third pull-down transistors, and the source of both the third pull-up and pull-down transistors being connected in common with the gate of the p-channel FET and the drain of the second pull-up transistor, and the drain of both the third pull-up and pull-down transistors being connected in common with the gate of the n-channel FET and the drain of the first pull-down transistor.

* * * * *